United States Patent
Teranishi

(10) Patent No.: US 8,530,134 B2
(45) Date of Patent: Sep. 10, 2013

(54) PROCESS FOR PRODUCING PHOTORESIST POLYMERIC COMPOUNDS

(75) Inventor: Tadashi Teranishi, Himeji (JP)

(73) Assignee: Daicel Chemical Industries, Ltd., Osaka-shi (JP)

(*) Notice: Subject to any disclaimer, the term of this patent is extended or adjusted under 35 U.S.C. 154(b) by 258 days.

(21) Appl. No.: 12/781,866

(22) Filed: May 18, 2010

(65) Prior Publication Data

US 2010/0297551 A1   Nov. 25, 2010

(30) Foreign Application Priority Data

May 19, 2009 (JP) ................................. 2009-121444

(51) Int. Cl.
- *G03F 7/00* (2006.01)
- *C08F 10/00* (2006.01)
- *C08F 32/08* (2006.01)

(52) U.S. Cl.
USPC .......................... 430/270.1; 526/280; 526/281

(58) Field of Classification Search
USPC ............................... 430/270.1; 526/280, 281
See application file for complete search history.

(56) References Cited

U.S. PATENT DOCUMENTS

| | | | | |
|---|---|---|---|---|
| 4,025,828 A | * | 5/1977 | Sunamori et al. | 361/436 |
| 4,313,001 A | * | 1/1982 | Itoh et al. | 564/206 |
| 5,286,844 A | * | 2/1994 | Nishida et al. | 528/482 |
| 5,516,886 A | * | 5/1996 | Rahman et al. | 528/482 |
| 5,521,052 A | | 5/1996 | Rahman et al. | |
| 5,656,413 A | * | 8/1997 | Rahman et al. | 430/311 |
| 6,043,002 A | * | 3/2000 | Rahman | 430/326 |
| 6,455,665 B1 | * | 9/2002 | Barnette et al. | 528/272 |
| 6,773,872 B2 | * | 8/2004 | Gronbeck et al. | 430/326 |
| 6,984,751 B2 | * | 1/2006 | Takaki et al. | 560/209 |
| 7,015,291 B2 | | 3/2006 | Watanabe et al. | |
| 7,544,278 B2 | * | 6/2009 | Aminabhavi et al. | 204/522 |
| 7,655,743 B2 | | 2/2010 | Watanabe et al. | |
| 7,662,897 B2 | | 2/2010 | Watanabe et al. | |
| 7,741,429 B2 | * | 6/2010 | Russell et al. | 528/395 |
| 7,816,471 B2 | | 10/2010 | Watanabe et al. | |
| 7,989,138 B2 | * | 8/2011 | Furuya et al. | 430/270.1 |
| 8,007,981 B2 | * | 8/2011 | Watanabe et al. | 430/270.1 |
| 8,012,669 B2 | * | 9/2011 | Shimizu et al. | 430/270.1 |
| 8,021,823 B2 | * | 9/2011 | Shimizu et al. | 430/270.1 |
| 8,029,972 B2 | * | 10/2011 | Nakamura et al. | 430/270.1 |
| 8,053,165 B2 | * | 11/2011 | Kinsho et al. | 430/270.1 |
| 8,067,516 B2 | * | 11/2011 | Iijima et al. | 526/318 |
| 8,088,553 B2 | * | 1/2012 | Shimizu et al. | 430/270.1 |
| 8,114,949 B2 | * | 2/2012 | Ootake et al. | 526/319 |
| 2005/0100815 A1 | | 5/2005 | Watanabe et al. | |
| 2006/0116493 A1 | | 6/2006 | Watanabe et al. | |
| 2006/0116494 A1 | | 6/2006 | Watanabe et al. | |
| 2008/0268377 A1 | | 10/2008 | Watanabe et al. | |
| 2009/0042148 A1 | * | 2/2009 | Padmanaban et al. | 430/327 |
| 2010/0099836 A1 | | 4/2010 | Watanabe et al. | |
| 2010/0129758 A1 | * | 5/2010 | Maemori et al. | 430/325 |
| 2011/0046333 A1 | * | 2/2011 | Kubo et al. | 526/266 |
| 2011/0301379 A1 | * | 12/2011 | Ansai et al. | 560/221 |
| 2012/0071638 A1 | * | 3/2012 | Iijima et al. | 534/657 |

FOREIGN PATENT DOCUMENTS

| | | |
|---|---|---|
| JP | 10-512970 A | 12/1998 |
| JP | 2006-37117 A | 2/2006 |
| WO | WO 9414858 A1 * | 7/1994 |
| WO | WO 03/082933 A1 | 10/2003 |

\* cited by examiner

*Primary Examiner* — Amanda C. Walke

(74) *Attorney, Agent, or Firm* — Birch, Stewart, Kolasch & Birch, LLP

(57) ABSTRACT

Disclosed is a process for producing a photoresist polymeric compound. The process includes the steps of polymerizing a monomer mixture containing at least one monomer selected from a monomer (a) containing a group capable of leaving with an acid to allow the polymeric compound to be soluble in an alkali, a monomer (b) having a lactone skeleton, and a monomer (c) having a hydroxyl-containing alicyclic skeleton, to give a polymer; passing a solution containing the polymer through a filter including a porous membrane having an anion-exchange group to give a polymer solution; and thereafter passing the polymer solution through a filter including a porous membrane having a cation-exchange group. The polymer solution before passing through the filter including a porous membrane having a cation-exchange group preferably has a content of metals of 1000 ppb by weight or less per the weight of the polymer.

8 Claims, No Drawings

US 8,530,134 B2

PROCESS FOR PRODUCING PHOTORESIST POLYMERIC COMPOUNDS

BACKGROUND OF THE INVENTION

1. Field of the Invention

The present invention relates to a process for producing a photoresist polymeric compound (polymeric compound for photoresists) which is used typically for the preparation of photoresist resin compositions which in turn are adopted typically to fine patterning (microlithography) of semiconductor devices; to a process for producing a photoresist resin composition using a photoresist polymeric compound produced by the process; and to a process for producing a semiconductor device using the photoresist resin composition produced by the process.

2. Description of the Related Art

Positive-working photoresists used in fabrication of semiconductor devices should simultaneously have different characteristic properties such as a property of becoming soluble in an alkali in an exposed portion irradiated with light, adhesion to silicon wafers, plasma-etching resistance, and transparency to the light used. The positive-working photoresists are generally each used as a solution containing a base polymer, a photosensitive acid generator, and some types of additives for controlling the characteristic properties. Independently, the wavelength of a lithographic light source for use in the fabrication of semiconductor devices has become shorter year by year, and ArF excimer laser with a wavelength of 193 nm is promising as a next-generation light source. As photoresist polymers for use in such ArF excimer laser exposure system, there have been proposed various polymers having repeating units containing a lactone skeleton that exhibit high adhesion to substrates, and repeating units containing an alicyclic hydrocarbon skeleton that exhibits high etching resistance.

These polymers are generally prepared by polymerizing a monomer mixture to give a reaction mixture and isolating the target polymers by subjecting the reaction mixture to a precipitation treatment. The polymers produced in this manner, however, contain impurities such as metal components and thereby do not exhibit desired properties as resists (such as sensitivity) when used as resin components for photoresist resin compositions. Among such impurities, metal components such as sodium and iron, when contained in the polymers; adversely affect the electrical properties typically of semiconductor devices. Additionally, the resulting polymers are resistant to dissolution in a solvent for resist, because the surfaces of polymer particles become hard and/or the polymer particles fuse with each other when the isolated polymers are dried.

Japanese Unexamined Patent Application Publication (JP-A) No. 2006-37117 discloses a process for producing a photoresist polymeric compound having a lower sodium content by subjecting a monomer mixture to dropping polymerization to give a polymer; and subjecting the polymer to an extraction treatment with an organic solvent and water or passing a solution containing the polymer through a filter including a porous polyolefin membrane having a cation-exchange group, in which the monomer mixture contains at least one monomer selected from a monomer having a lactone skeleton, a monomer having a group capable of leaving with an acid to allow the polymeric compound to be soluble in an alkali, and a monomer having a hydroxyl-containing alicyclic skeleton. Even this process, however, does not always give a polymer sufficiently reduced in iron content, and the resulting polymeric compound may cause semiconductor devices to have deteriorated electrical properties.

SUMMARY OF THE INVENTION

Accordingly, it is an object of the present invention to provide a process for efficiently producing a photoresist polymeric compound having extremely low contents of metal components, particularly extremely low contents of sodium and iron. Another object of the present invention is to provide a process for efficiently producing a photoresist polymeric compound which does not adversely affects the electrical properties typically of semiconductor devices when the polymeric compound is used as a resin component of a photoresist resin composition. Still another object of the present invention is to provide processes for producing a photoresist resin composition and a semiconductor device, respectively, using the photoresist polymeric compound thus produced.

After intensive investigations to achieve the above objects, the present inventors have found that metal components, especially sodium and iron, which adversely affect performance of resists and electrical properties typically of semiconductor devices can be easily and efficiently removed by passing a solution containing a photoresist polymer through two porous membranes having specific two ion-exchange groups, respectively. The present invention has been made based on these findings.

Specifically, the present invention provides, in an embodiment, a process for producing a photoresist polymeric compound. The process includes the steps of carrying out polymerization of a monomer mixture containing at least one monomer selected from the group consisting of a monomer (a) containing a group capable of leaving with an acid to allow the polymeric compound to be soluble in an alkali, a monomer (b) having a lactone skeleton, and a monomer (c) having a hydroxyl-containing alicyclic skeleton, to give a polymer; passing a solution containing the polymer through a filter including a porous membrane having an anion-exchange group to give a polymer solution; and thereafter passing the polymer solution through a filter including a porous membrane having a cation-exchange group.

The polymer solution before the step of passing through the filter including a porous membrane having a cation-exchange group preferably has a content of metals of 1000 parts per billion by weight or less per the weight of the polymer.

The polymerization of the mixtures of monomers is preferably performed through dropping polymerization to give the polymer.

The production process preferably further includes the step of washing the polymer solution with water after the step of carrying out polymerization and before the step of passing the polymer solution through the filter including a porous membrane having an anion-exchange group.

The monomer (a) containing a group capable of leaving with an acid to allow the polymeric compound to be soluble in an alkali can be, for example, at least one of compounds represented by following Formula (1a) to (1e):

(1a)
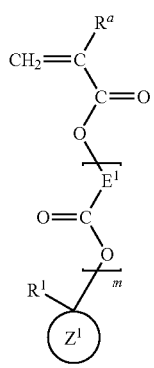

(1b)
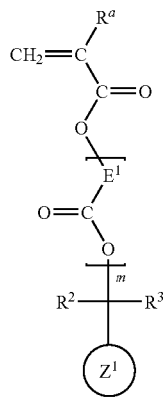

(1c)
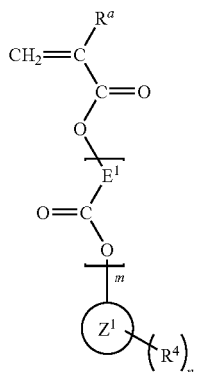

(1d)
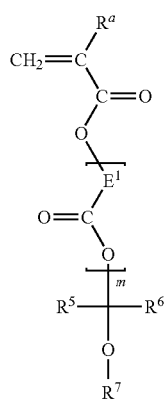

-continued (1e)
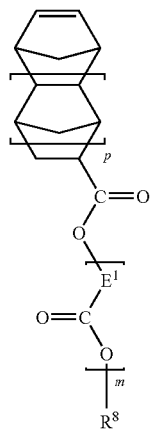

wherein Ring $Z^1$ represents a substituted or unsubstituted monocyclic or polycyclic alicyclic hydrocarbon ring having 5 to 20 carbon atoms; $R^a$ represents one selected from the group consisting of hydrogen atom, a halogen atom, and an alkyl or haloalkyl group having 1 to 6 carbon atoms; $E^1$s each represent a bivalent hydrocarbon group having 1 to 12 carbon atoms; "m" denotes an integer of 0 to 3; $R^1$, $R^2$, and $R^3$ are the same as or different from one another and each represent a substituted or unsubstituted alkyl group having 1 to 6 carbon atoms; $R^4$s are substituents bonded to Ring $Z^1$, are the same as or different from each other, and each represent one selected from the group consisting of oxo group, an alkyl group, a protected or unprotected hydroxyl group, a protected or unprotected hydroxyalkyl group, and a protected or unprotected carboxyl group; "n" is the number of $R^4$s and denotes an integer of 1 to 3, wherein at least one of $nR^4$s is a —$COOR^i$ group, wherein $R^i$ represents one selected from the group consisting of a substituted or unsubstituted tertiary hydrocarbon group, a tetrahydrofuranyl group, a tetrahydropyranyl group, and an oxepanyl group; $R^5$ and $R^6$ are the same as or different from each other and each represent hydrogen atom, or a substituted or unsubstituted alkyl group having 1 to 6 carbon atoms; $R^7$ represents hydrogen atom or an organic group, wherein at least two of $R^5$, $R^6$, and $R^7$ may be combined to form a ring with an adjacent atom; $R^8$ represents one selected from the group consisting of t-butyl group, 2-tetrahydrofuranyl group, 2-tetrahydropyranyl group, and 2-oxepanyl group; and "p" denotes 0 or 1.

The monomer (b) having a lactone skeleton can be, for example, at least one of compounds represented by following Formula (2a) to (2h):

(2a)
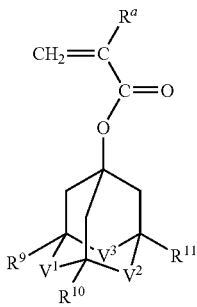

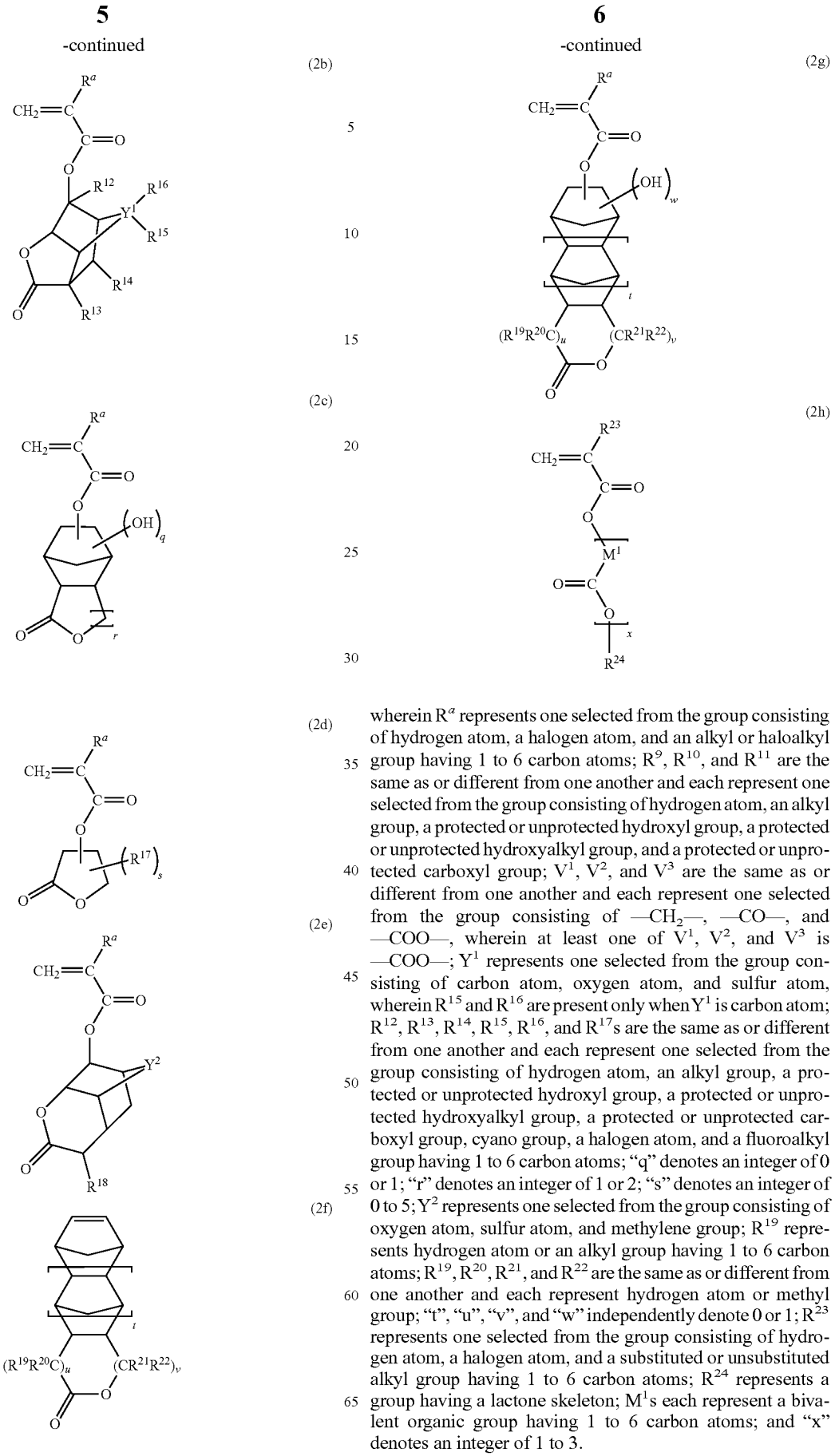

wherein $R^a$ represents one selected from the group consisting of hydrogen atom, a halogen atom, and an alkyl or haloalkyl group having 1 to 6 carbon atoms; $R^9$, $R^{10}$, and $R^{11}$ are the same as or different from one another and each represent one selected from the group consisting of hydrogen atom, an alkyl group, a protected or unprotected hydroxyl group, a protected or unprotected hydroxyalkyl group, and a protected or unprotected carboxyl group; $V^1$, $V^2$, and $V^3$ are the same as or different from one another and each represent one selected from the group consisting of —$CH_2$—, —CO—, and —COO—, wherein at least one of $V^1$, $V^2$, and $V^3$ is —COO—; $Y^1$ represents one selected from the group consisting of carbon atom, oxygen atom, and sulfur atom, wherein $R^{15}$ and $R^{16}$ are present only when $Y^1$ is carbon atom; $R^{12}$, $R^{13}$, $R^{14}$, $R^{15}$, $R^{16}$, and $R^{17}$s are the same as or different from one another and each represent one selected from the group consisting of hydrogen atom, an alkyl group, a protected or unprotected hydroxyl group, a protected or unprotected hydroxyalkyl group, a protected or unprotected carboxyl group, cyano group, a halogen atom, and a fluoroalkyl group having 1 to 6 carbon atoms; "q" denotes an integer of 0 or 1; "r" denotes an integer of 1 or 2; "s" denotes an integer of 0 to 5; $Y^2$ represents one selected from the group consisting of oxygen atom, sulfur atom, and methylene group; $R^{19}$ represents hydrogen atom or an alkyl group having 1 to 6 carbon atoms; $R^{19}$, $R^{20}$, $R^{21}$, and $R^{22}$ are the same as or different from one another and each represent hydrogen atom or methyl group; "t", "u", "v", and "w" independently denote 0 or 1; $R^{23}$ represents one selected from the group consisting of hydrogen atom, a halogen atom, and a substituted or unsubstituted alkyl group having 1 to 6 carbon atoms; $R^{24}$ represents a group having a lactone skeleton; $M^1$s each represent a bivalent organic group having 1 to 6 carbon atoms; and "x" denotes an integer of 1 to 3.

The monomer (c) having a hydroxyl-containing alicyclic skeleton can be, for example, at least one of compounds represented by following Formula (3a):

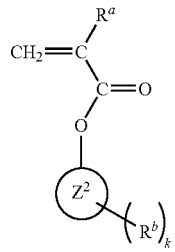

(3a)

wherein $R^a$ represents one selected from the group consisting of hydrogen atom, a halogen atom, and an alkyl or haloalkyl group having 1 to 6 carbon atoms; Ring $Z^2$ represents a monocyclic or polycyclic alicyclic hydrocarbon ring having 5 to 20 carbon atoms; $R^b$s are substituents bonded to Ring $Z^2$ and represent one selected from the group consisting of a halogen atom, an alkyl or haloalkyl group having 1 to 6 carbon atoms, an alkoxy group having 1 to 6 carbon atoms, hydroxyl group, carboxyl group, and amino group; and "k" denotes an integer of 1 to 4, wherein, when "k" is 2 or more, two or more $R^b$s may be the same as or different from each other, and wherein at least one of $kR^b$s is hydroxyl group.

The present invention further provides, in another embodiment, a process for producing a photoresist resin composition. This process includes the steps of producing a photoresist polymeric compound by the above-mentioned process; and mixing the resulting photoresist polymeric compound with a photosensitive acid generator.

In still another embodiment, the present invention provides a process for producing a semiconductor device. This process includes the steps of producing a photoresist resin composition by the above-mentioned process; forming a photosensitive layer with the photoresist resin composition; and exposing, developing, and thereby patterning the photosensitive layer.

According to the present invention, a photoresist polymeric compound which has an extremely low content of metal components, especially sodium and iron, can be efficiently produced. The resulting photoresist polymeric compound thus efficiently produced does not adversely affect electrical properties typically of semiconductor devices when used as a resin component for a photoresist resin composition. Additionally, the produced photoresist polymeric compound enables easy production of a photoresist resin composition and a semiconductor device.

Other objects, features and advantages of the present invention will be understood more fully from the following detailed description. All numbers are herein assumed to be modified by the term "about."

DESCRIPTION OF THE PREFERRED EMBODIMENTS

According to an embodiment of the present invention, a solution containing a polymer is passed through two filters including specific two porous membranes, respectively, in which the polymer is obtained through polymerization of a monomer mixture containing at least one monomer selected from a monomer (a) containing a group capable of leaving with an acid to allow the resulting polymeric compound to be soluble in an alkali, a monomer (b) having a lactone skeleton, and a monomer (c) having a hydroxyl-containing alicyclic skeleton.

The monomer (a) containing a group capable of leaving with an acid to allow the polymeric compound to be soluble in an alkali imparts an alkali-solubility to the polymer. Representative examples of the monomer (a) containing a group capable of leaving with an acid to allow the polymeric compound to be soluble in an alkali include compounds represented by Formulae (1a) to (1e). Each of such compounds as monomers (a) can be used alone or in combination.

In Formulae (1a) to (1e), Ring $Z^1$ represents a substituted or unsubstituted monocyclic or polycyclic alicyclic hydrocarbon ring having 5 to 20 carbon atoms. $R^a$ represents hydrogen atom, a halogen atom, or an alkyl or haloalkyl group having 1 to 6 carbon atoms. $E^1$ represents a bivalent hydrocarbon group having 1 to 12 carbon atoms; and "m" denotes an integer of 0 to 3. $R^1$ to $R^3$ are the same as or different from one another and each represent a substituted or unsubstituted alkyl group having 1 to 6 carbon atoms. $R^4$s are substituents bonded to Ring $Z^1$, are the same as or different from each other, and each represent oxo group, an alkyl group, a protected or unprotected hydroxyl group, a protected or unprotected hydroxyalkyl group, or a protected or unprotected carboxyl group. The number "n" is the number of $R^4$s and denotes an integer of 1 to 3, in which at least one of $nR^4$s is a —$COOR^i$ group, in which $R^i$ represents a substituted or unsubstituted tertiary hydrocarbon group, tetrahydrofuranyl group, tetrahydropyranyl group, or oxepanyl group. $R^5$ and $R^6$ are the same as or different from each other and each represent hydrogen atom or a substituted or unsubstituted alkyl group having 1 to 6 carbon atoms. $R^7$ represents hydrogen atom or an organic group. At least two of $R^5$, $R^6$, and $R^7$ may be combined to form a ring with an adjacent atom. $R^8$ represents t-butyl group, 2-tetrahydrofuranyl group, 2-tetrahydropyranyl group, or 2-oxepanyl group. The number "p" denotes 0 or 1.

As $R^a$, exemplary halogen atoms include fluorine, chlorine, and bromine atoms. Exemplary alkyl groups having 1 to 6 carbon atoms include methyl, ethyl, propyl, isopropyl, butyl, isobutyl, s-butyl, t-butyl, and hexyl groups. Exemplary halo-alkyl groups having 1 to 6 carbon atoms include groups corresponding to the alkyl groups having 1 to 6 carbon atoms, except with at least one hydrogen atom replaced by fluorine atom, such as monofluoromethyl, difluoromethyl, trifluoromethyl, 2,2,2-trifluoroethyl, tetrafluoroethyl, and 2,2,3,3,3-tetrafluoropropyl groups. The substituent $R^a$ is preferably hydrogen atom or an alkyl group having 1 to 6 carbon atoms, and is more preferably hydrogen atom or methyl group.

As $E^1$, exemplary bivalent hydrocarbon groups having 1 to 12 carbon atoms include alkylene groups such as methylene, ethylene, propylene, trimethylene, tetramethylene, hexamethylene, octamethylene, decamethylene, and dodecamethylene groups; alkenylene groups such as vinylene, 1-propenylene, and 3-methyl-2-butenylene groups; cycloalkylene groups such as 1,2-cyclopentylene, 1,3-cyclopentylene, 1,2-cyclohexylene, 1,3-cyclohexylene, and 1,4-cyclohexylene groups; cycloalkylidene groups such as cyclopentylidene and cyclohexylidene groups; bivalent bridged hydrocarbon groups such as adamantanediyl, norbornanediyl, isobornanediyl, tricyclodecanediyl, and tetracyclodecanediyl groups; bivalent aromatic hydrocarbon groups such as 1,2-phenylene, 1,3-phenylene, 1,4-phenylene, 1,5-naphthylene, 2,6-naphthylene, and anthranylene groups; and groups each including two or more of these groups combined with each other.

As $R^1$ to $R^3$, $R^5$ and $R^6$, exemplary substituted or unsubstituted alkyl groups having 1 to 6 carbon atoms include linear or branched-chain alkyl groups having 1 to 6 carbon atoms, such as methyl, ethyl, propyl, isopropyl, butyl, isobutyl, s-butyl, t-butyl, and hexyl groups; and haloalkyl groups having 1 to 6 carbon atoms, such as trifluoromethyl group. In Formula (30), exemplary alkyl groups as $R^4$ include linear or branched-chain alkyl groups having about 1 to 20 carbon atoms, such as methyl, ethyl, propyl, isopropyl, butyl, isobutyl, s-butyl, t-butyl, hexyl, octyl, decyl, and dodecyl groups. Exemplary protected or unprotected hydroxyl groups as $R^4$ include hydroxyl group; and substituted oxy groups, including alkoxy groups having 1 to 4 carbon atoms, such as methoxy, ethoxy, and propoxy groups. Exemplary protected or unprotected hydroxyalkyl groups include groups each composed of an alkylene group having 1 to 6 carbon atoms and, bonded thereto, any of the protected or unprotected hydroxyl groups. As $R^i$ in the group —$COOR^i$ as $R^4$, exemplary tertiary hydrocarbon groups include t-butyl, t-amyl, 2-methyl-2-adamantyl, and (1-methyl-1-adamantyl)ethyl groups; exemplary tetrahydrofuranyl groups include 2-tetrahydrofuranyl group; exemplary tetrahydropyranyl groups include 2-tetrahydropyranyl group; and exemplary oxepanyl groups include 2-oxepanyl group.

The alicyclic hydrocarbon ring having 5 to 20 carbon atoms as Ring $Z^1$ may be a monocyclic ring, or a polycyclic ring such as fused ring or bridged ring. Representative alicyclic hydrocarbon rings include cyclohexane ring, cyclooctane ring, cyclodecane ring, adamantane ring, norbornane ring, norbornene ring, bornane ring, isobornane ring, perhydroindene ring, decahydronaphthalene ring, perhydrofluorene ring (tricyclo[7.4.0.0$^{3,8}$]tridecane ring), perhydroanthracene ring, tricyclo[5.2.1.0$^{2,6}$]decane ring, tricyclo[4.2.2.1$^{2,5}$]undecane ring, and tetracyclo[4.4.0.1$^{2,5}$.1$^{7,10}$]dodecane ring. These alicyclic hydrocarbon rings may each have one or more substituents. Exemplary substituents include methyl group and other alkyl groups (of which alkyl groups having 1 to 4 carbon atoms are preferred); halogen atoms such as chlorine atom; protected or unprotected hydroxyl groups; oxo group; and protected or unprotected carboxyl groups. Ring $Z^1$ is preferably a polycyclic alicyclic hydrocarbon ring (bridged hydrocarbon ring) such as adamantane ring.

Exemplary organic groups as $R^7$ include groups each containing a hydrocarbon group and/or a heterocyclic group. Exemplary hydrocarbon groups include aliphatic hydrocarbon groups, alicyclic hydrocarbon groups, aromatic hydrocarbon groups, and groups each composed of two or more of these combined with each other. Examples of the aliphatic hydrocarbon groups include linear or branched-chain alkyl groups such as methyl, ethyl, propyl, isopropyl, butyl, isobutyl, s-butyl, t-butyl, hexyl, and octyl groups (of which alkyl groups having 1 to 8 carbon atoms are preferred); linear or branched-chain alkenyl groups such as allyl group (of which alkenyl groups having 2 to 8 carbon atoms are preferred); and linear or branched-chain alkynyl groups such as propynyl group (of which alkynyl groups having 2 to 8 carbon atoms are preferred). Examples of the alicyclic hydrocarbon groups include cycloalkyl groups such as cyclopropyl, cyclopentyl, and cyclohexyl groups (of which cycloalkyl groups having 3 to 8 members are preferred); cycloalkenyl groups such as cyclopentenyl and cyclohexenyl groups (of which cycloalkenyl groups having 3 to 8 members are preferred); bridged carbocyclic groups such as adamantyl and norbornyl groups (of which bridged carbocyclic groups having 4 to 20 carbon atoms are preferred). Examples of the aromatic hydrocarbon groups include aromatic hydrocarbon groups having 6 to 14 carbon atoms, such as phenyl and naphthyl groups. Exemplary groups composed of an aliphatic hydrocarbon group and an aromatic hydrocarbon group combined with each other include benzyl and 2-phenylethyl groups. These hydrocarbon groups may each have one or more substituents including alkyl groups (such as alkyl groups having 1 to 4 carbon atoms), haloalkyl groups (such as haloalkyl groups having 1 to 4 carbon atoms), halogen atoms, protected or unprotected hydroxyl groups, protected or unprotected hydroxymethyl groups, protected or unprotected carboxyl groups, and oxo group. Protecting groups in "protected groups" can be any of protecting groups commonly used in organic syntheses.

Preferred examples of the organic group include alkyl groups having 1 to 8 carbon atoms, and organic groups containing a cyclic skeleton. Examples of the "ring" constituting the cyclic skeleton include monocyclic or polycyclic nonaromatic or aromatic carbocycles and heterocycles. Among them, especially preferred are monocyclic or polycyclic non-aromatic carbon rings, and lactone rings (to which a nonaromatic carbocycle may be fused). Exemplary monocyclic non-aromatic carbocycles include cycloalkane rings having about 3 to 15 members, such as cyclopentane ring and cyclohexane ring.

Representative examples of monomers of Formula (1a) include, but are not limited to, 2-(meth)acryloyloxy-2-methyladamantanes, 1-hydroxy-2-(meth)acryloyloxy-2-methyladamantanes, 5-hydroxy-2-(meth)acryloyloxy-2-methyladamantanes, 2-(meth)acryloyloxy-2-ethyladamantanes, and 2-(meth)acryloyloxy-2,5,7-trimethyladamantanes.

Representative examples of monomers of Formula (1b) include, but are not limited to, 1-(1-(meth)acryloyloxy-1-methylethyl)adamantanes, 1-hydroxy-3-(1-(meth)acryloyloxy-1-methylethyl)adamantanes, 1-(1-ethyl-1-(meth)acryloyloxypropyl)adamantanes, 1-(1-(meth)acryloyloxy-1-methylpropyl)adamantanes, and 1-(1-(meth)acryloyloxy-1-methylethyl)-3,5-dimethyladamantanes.

Representative examples of monomers of Formula (1c) include, but are not limited to, 1-t-butoxycarbonyl-3-(meth)acryloyloxyadamantanes and 1-(2-tetrahydropyranyloxycarbonyl)-3-(meth)acryloyloxyadamantanes.

Representative examples of monomers of Formula (1d) include, but are not limited to, 1-adamantyloxy-1-ethyl (meth)acrylates, 1-adamantylmethyloxy-1-ethyl (meth)acrylates, 2-(1-adamantylethyl)oxy-1-ethyl (meth)acrylates, 1-bornyloxy-1-ethyl(meth)acrylates, 2-norbornyloxy-1-ethyl(meth)acrylates, 2-tetrahydropyranyl (meth)acrylates, and 2-tetrahydrofuranyl(meth)acrylates.

Each of the compounds represented by Formula (1d) can be prepared, for example, by reacting a corresponding vinyl ether compound and (meth)acrylic acid by the catalysis of an acid catalyst according to a common procedure. Typically, 1-adamantyloxy-1-ethyl(meth)acrylate can be prepared by reacting 1-adamantyl-vinyl ether and (meth)acrylic acid in the presence of an acid catalyst.

Representative examples of monomers of Formula (1e) include, but are not limited to, 5-t-butoxycarbonylnorbornene, 9-t-butoxycarbonyltetracyclo[6.2.1$^{3,6}$.0$^{2,7}$]dodec-4-ene, 5-(2-tetrahydropyranyloxycarbonyl)norbornene, and 9-(2-tetrahydropyranyloxycarbonyl)tetracyclo[6.2.1.1$^{3,6}$.0$^{2,7}$]dodec-4-ene.

Among them, compounds represented by Formula (1a) or Formula (1b) are preferred, of which compounds in which Ring $Z^1$ is adamantane ring are more preferred.

The monomer (b) having a lactone skeleton allows the polymer to have adhesion to substrates. Some of monomers (b) having certain structures (e.g., repeating units having a β-(meth)acryloyloxy-γ-butyrolactone skeleton) may leave with an acid and thereby allow the polymer be soluble in an alkali. Representative examples of monomers (b) having a lactone skeleton include compounds represented by Formulae (2a) to (2h). Each of such compounds as monomers (b) can be used alone or in combination.

In Formulae (2a) to (2h), $R^a$ represents hydrogen atom, a halogen atom, or an alkyl or haloalkyl group having 1 to 6 carbon atoms. $R^9$ to $R^{11}$ are the same as or different from one another and each represent hydrogen atom, an alkyl group, a protected or unprotected hydroxyl group, a protected or unprotected hydroxyalkyl group, or a protected or unprotected carboxyl group. $V^1$ to $V^3$ are the same as or different from one another and each represent —$CH_2$—, —CO—, or —COO—, in which at least one of $V^1$ to $V^3$ is —COO—. $Y^1$ represents carbon atom, oxygen atom, or sulfur atom, in Which $R^{15}$ and $R^{16}$ are present only when $Y^1$ is carbon atom. $R^{12}$ to $R^{16}$, and $R^{17}$ are the same as or different from one another and each represent hydrogen atom, an alkyl group, a protected or unprotected hydroxyl group, a protected or unprotected hydroxyalkyl group, a protected or unprotected carboxyl group, cyano group, a halogen atom, or a fluoroalkyl group having 1 to 6 carbon atoms. The number "q" denotes an integer of 0 or 1. The number "r" denotes an integer of 1 or 2; and the number "s" denotes an integer of 0 to 5. $Y^2$ represents oxygen atom, sulfur atom, or methylene group. $R^{18}$ represents hydrogen atom or an alkyl group having 1 to 6 carbon atoms. $R^{19}$, $R^{20}$, $R^{21}$, and $R^{22}$ are the same as or different from one another and each represent hydrogen atom or methyl group. The numbers "t", "u", "v", and "w" each independently denote 0 or 1. $R^{23}$ represents hydrogen atom, a halogen atom, or a substituted or unsubstituted alkyl group having 1 to 6 carbon atoms. $R^{24}$ represents a group having a lactone skeleton; $M^1$ represents a bivalent organic group having 1 to 6 carbon atoms; and "x" denotes an integer of 1 to 3.

$R^a$ is as described above. Exemplary alkyl groups usable herein as $R^9$ to $R^{11}$, $R^{12}$ to $R^{16}$, and $R^{17}$ include the alkyl groups having 1 to 6 carbon atoms listed as $R^a$. Exemplary halogen atoms as $R^{12}$ to $R^{16}$, and $R^{17}$ include fluorine, chlorine, and bromine atoms. Protecting groups in "protected groups" can be any of protecting groups commonly used in organic syntheses.

Representative examples of monomers of Formula (2a) include, but are not limited to, 1-(meth)acryloyloxy-4-oxatricyclo[4.3.1.1$^{3,8}$]undecan-5-ones, 1-(meth)acryloyloxy-4,7-dioxatricyclo[4.4.1.1$^{3,9}$]dodecane-5,8-diones, 1-(meth)acryloyloxy-4,8-dioxatricyclo[4.4.1.1$^{3,9}$]dodecane-5,7-diones, 1-(meth)acryloyloxy-5,7-dioxatricyclo[4.4.1.1$^{3,9}$]dodecane-4,8-diones, 1-(meth)acryloyloxy-3-hydroxyadamantanes, 1-(meth)acryloyloxy-3,5-dihydroxyadamantanes, 1-(meth)acryloyloxy-3,5,7-trihydroxyadamantanes, 1-(meth)acryloyloxy-3-hydroxy-5,7-dimethyladamantanes, and 1-(meth)acryloyloxy-3-carboxyadamantanes.

Representative examples of monomers of Formula (2b) include, but not limited to, the following compounds. Typically, representative examples of monomers of Formula (2b) wherein $Y^1$ is carbon atom include 5-(meth)acryloyloxy-3-oxatricyclo[4.2.1.0$^{4,8}$]nonan-2-ones, 5-(meth)acryloyloxy-5-methyl-3-oxatricyclo[4.2.1.0$^{4,8}$]nonan-2-ones, 5-(meth)acryloyloxy-1-methyl-3-oxatricyclo[4.2.1.0$^{4,8}$]nonan-2-ones, 5-(meth)acryloyloxy-9-methyl-3-oxatricyclo[4.2.1.0$^{4,8}$]nonan-2-ones, 5-(meth)acryloyloxy-9-carboxy-3-oxatricyclo[4.2.1.0$^{4,8}$]nonan-2-ones, 5-(meth)acryloyloxy-9-methoxycarbonyl-3-oxatricyclo[4.2.1.0$^{4,8}$]nonan-2-ones, 5-(meth)acryloyloxy-9-ethoxycarbonyl-3-oxatricyclo[4.2.1.0$^{4,8}$]nonan-2-ones, and 5-(meth)acryloyloxy-9-t-butoxycarbonyl-3-oxatricyclo[4.2.1.0$^{4,8}$]nonan-2-ones.

The representative examples of monomers of Formula (2b) wherein $Y^1$ is carbon atom further include 1-cyano-5-(meth)acryloyloxy-3-oxatricyclo[4.2.1.0$^{4,8}$]nonan-2-ones, 1-fluoro-5-(meth)acryloyloxy-3-oxatricyclo[4.2.1.0$^{4,8}$]nonan-2-ones, 1-chloro-5-(meth)acryloyloxy-3-oxatricyclo[4.2.1.0$^{4,8}$]nonan-2-ones, 1-chloro-5-(meth)acryloyloxy-3-oxatricyclo[4.2.1.0$^{4,8}$]nonan-2-ones, 1-trifluoromethyl-5-(meth)acryloyloxy-3-oxatricyclo[4.2.1.0$^{4,8}$]nonan-2-ones, 9-cyano-5-(meth)acryloyloxy-3-oxatricyclo[4.2.1.0"]nonan-2-ones, 9-fluoro-5-(meth)acryloyloxy-3-oxatricyclo[4.2.1.0$^{4,8}$]nonan-2-ones, 9-chloro-5-(meth)acryloyloxy-3-oxatricyclo[4.2.1.0$^{4,8}$]nonan-2-ones, 9-chloro-5-(meth)acryloyloxy-3-oxatricyclo[4.2.1.0$^{4,8}$]nonan-2-ones, and 9-trifluoromethyl-5-(meth)acryloyloxy-3-oxatricyclo[4.2.1.0$^{4,8}$]nonan-2-ones.

Representative examples of monomers of Formula (2b) wherein $Y^1$ is oxygen atom include 1-cyano-5-(meth)acryloyloxy-3,7-dioxatricyclo[4.2.1.0$^{4,8}$]nonan-2-ones, 1-fluoro-5-(meth)acryloyloxy-3,7-dioxatricyclo[4.2.1.0$^{4,8}$]nonan-2-ones, 1-chloro-5-(meth)acryloyloxy-3,7-dioxatricyclo[4.2.1.0$^{4,8}$]nonan-2-ones, 1-chloro-5-(meth)acryloyloxy-3,7-dioxatricyclo[4.2.1.0$^{4,8}$]nonan-2-ones, 1-trifluoromethyl-5-(meth)acryloyloxy-3,7-dioxatricyclo[4.2.1.0$^{4,8}$]nonan-2-ones, 9-cyano-5-(meth)acryloyloxy-3,7-dioxatricyclo[4.2.1.0$^{4,8}$]nonan-2-ones, 9-fluoro-5-(meth)acryloyloxy-3,7-dioxatricyclo[4.2.1.0$^{4,8}$]nonan-2-ones, 9-chloro-5-(meth)acryloyloxy-3,7-dioxatricyclo[4.2.1.0$^{4,8}$]nonan-2-ones, 9-chloro-5-(meth)acryloyloxy-3,7-dioxatricyclo[4.2.1.0$^{4,8}$]nonan-2-ones, and 9-trifluoromethyl-5-(meth)acryloyloxy-3,7-dioxatricyclo[4.2.1.0$^{4,8}$]nonan-2-ones.

Representative examples of monomers of Formula (2c) include, but are not limited to, 8-(meth)acryloyloxy-4-oxatricyclo[5.2.1.0$^{2,6}$]decan-5-ones and 9-(meth)acryloyloxy-4-oxatricyclo[5.2.1.0$^{2,6}$]decan-5-ones.

Representative examples of monomers of Formula (2d) include, but are not limited to, α-(meth)acryloyloxy-γ-butyrolactones such as α-(meth)acryloyloxy-γ-butyrolactones, α-(meth)acryloyloxy-α-methyl-γ-butyrolactones, α-(meth)acryloyloxy-β,β-dimethyl-γ-butyrolactones, α-(meth)acryloyloxy-α,β,β-trimethyl-γ-butyrolactones, α-(meth)acryloyloxy-γ,γ-dimethyl-γ-butyrolactones, α-(meth)acryloyloxy-α,γ,γ-trimethyl-γ-butyrolactones, α-(meth)acryloyloxy-β,β,γ,γ-tetramethyl-γ-butyrolactones, α-(meth)acryloyloxy-α,β,β,γ,γ-pentamethyl-γ-butyrolactones, α-(meth)acryloyloxy-γ-butyrolactones, α-(meth)acryloyloxy-α-methyl-γ-butyrolactones, α-(meth)acryloyloxy-β,β-dimethyl-γ-butyrolactones, α-(meth)acryloyloxy-α,β,β-trimethyl-γ-butyrolactones, α-(meth)acryloyloxy-γ,γ-dimethyl-γ-butyrolactones, α-(meth)acryloyloxy-α,γ,γ-trimethyl-γ-butyrolactones, α-(meth)acryloyloxy-β,β,γ,γ-tetramethyl-γ-butyrolactones, and α-(meth)acryloyloxy-α,β,β,γ,γ-pentamethyl-γ-butyrolactones; and β-(meth)acryloyloxy-γ-butyrolactones such as β-(meth)acryloyloxy-γ-butyrolactones and β-(meth)acryloyloxy-γ-butyrolactones.

Representative examples of monomers of Formula (2e) include, but are not limited to, 5-(meth)acryloyloxy-4-oxatricyclo[5.2.1.0$^{5,9}$]decan-3-ones, 2-methyl-5-(meth)acryloyloxy-4-oxatricyclo[5.2.1.0$^{5,9}$]decan-3-ones, 2-ethyl-5-(meth)acryloyloxy-4-oxatricyclo[5.2.1.0$^{5,9}$]decan-3-ones, 5-(meth)acryloyloxy-4,8-dioxatricyclo[5.2.1.0$^{5,9}$]decan-3-ones, 2-methyl-5-(meth)acryloyloxy-4,8-dioxatricyclo[5.2.1.0$^{5,9}$]decan-3-ones, and 2-ethyl-5-(meth)acryloyloxy-4,8-dioxatricyclo[5.2.1.0$^{5,9}$]decan-3-ones.

Representative examples of monomers represented by Formula (2f) include, but are not limited to, 4-oxatricyclo[5.2.1.0$^{2,6}$]dec-8-en-5-one, 3-oxatricyclo[5.2.1.0$^{2,6}$]dec-8-en-4-one, 5-oxatricyclo[6.2.1.0$^{2,7}$]undec-9-en-6-one, 4-oxatricyclo[6.2.1.0$^{2,7}$]undec-9-en-5-one, 4-oxapentacyclo[6.5.1.1$^{9,12}$.0$^{2,6}$.0$^{8,13}$]pentadec-10-en-5-one, 3-oxapentacyclo[6.6.1.1$^{10,13}$.0$^{2,7}$,0$^{9,14}$]hexadec-11-en-6-one, and 4-oxapentacyclo[6.6.1.1$^{10,13}$.0$^{2,7}$.0$^{9,14}$]hexadec-11-en-5-one.

Representative examples of monomers of Formula (2g) include, but are not limited to, 8-(meth)acryloyloxy-4-oxatricyclo[5.2.1.0$^{2,6}$]decan-5-ones [i.e., 9-(meth)acryloyloxy-4-oxatricyclo[5.2.1.0$^{2,6}$]decan-3-ones], 9-(meth)acryloyloxy-4-oxatricyclo[5.2.1.0$^{2,6}$]decan-5-ones [i.e., 8-(meth) acryloyloxy-4-oxatricyclo[5.2.1.0$^{2,6}$]decan-3-ones], 8-(meth)acryloyloxy-9-hydroxy-4-oxatricyclo[5.2.1.0$^{2,6}$] decan-5-ones [i.e., 9-(meth)acryloyloxy-8-hydroxy-4-oxatricyclo[5.2.1.0$^{2,6}$]decan-3-ones], 9-(meth)acryloyloxy-8-hydroxy-4-oxatricyclo[5.2.1.0$^{2,6}$]decan-5-ones [i.e., 8-((meth)acryloyloxy-9-hydroxy-4-oxatricyclo[5.2.1.0$^{2,6}$] decan-3-ones], 8-(meth)acryloyloxy-3-oxatricyclo[5.2.1.0$^{2,6}$]decan-4-ones, 9-(meth)acryloyloxy-4-oxatricyclo [6.2.1.0$^{2,7}$]undecan-3-ones, 10-(meth)acryloyloxy-4-oxatricyclo[6.2.1.0$^{2,7}$]undecan-3-ones, 9-(meth)acryloyloxy-4-oxatricyclo[6.2.1.0$^{2,7}$]undecan-5-ones, and 10-(meth) acryloyloxy-4-oxatricyclo[6.2.1.0$^{2,7}$]undecan-5-ones.

As $R^{23}$ in compounds of Formula (2h), exemplary halogen atoms include fluorine, chlorine, and bromine atoms. Exemplary alkyl group having 1 to 6 carbon atoms include methyl, ethyl, propyl, isopropyl, butyl, isobutyl, s-butyl, t-butyl, pentyl, and hexyl groups; of which alkyl groups having 1 to 4 carbon atoms are preferred, and methyl group is more preferred. Exemplary substituted alkyl groups having 1 to 6 carbon atoms include halo-alkyl groups having 1 to 6 carbon atoms, including chloroalkyl groups such as chloromethyl group; and fluoroalkyl groups such as trifluoromethyl, 2,2,2-trifluoroethyl, and pentafluoroethyl groups (of which fluoroalkyl groups having 1 to 3 carbon atoms are preferred). $R^{23}$ is preferably hydrogen atom, an alkyl group having 1 to 3 carbon atoms, such as methyl group, or a haloalkyl group having 1 to 3 carbon atoms, such as trifluoromethyl group, and is more preferably hydrogen atom or methyl group.

As $R^{24}$, exemplary groups having a lactone skeleton include groups having a lactone skeleton composed of a monocyclic lactone ring such as γ-butyrolactone ring, ε-valerolactone ring, or ε-caprolactone ring; and groups having a polycyclic lactone skeleton composed of a lactone ring such as 6-oxabicyclo[3.2.1$^{1,5}$]octan-7-one ring and 3-oxatricyclo [4.2.1.0$^{4,8}$]nonan-2-one ring. Among them, groups having a lactone skeleton composed of a monocyclic lactone ring are preferred, of which monocyclic groups having a lactone skeleton composed of γ-butyrolactone ring are more preferred.

The lactone skeleton may have one or more substituents. Exemplary substituent include alkyl groups such as methyl group (of which alkyl groups having 1 to 4 carbon atoms are preferred); haloalkyl groups such as trifluoromethyl group (of which haloalkyl groups having 1 to 4 carbon atoms are preferred); halogen atoms such as chlorine atom and fluorine atom; protected or unprotected hydroxyl groups; protected or unprotected hydroxyalkyl groups; protected or unprotected mercapto groups; protected or unprotected carboxyl groups; protected or unprotected amino groups; and protected or unprotected sulfonic groups. The protecting groups in "protected groups" can be any of protecting groups commonly used in organic syntheses.

The lactone skeleton in $R^{24}$ in Formula (2h) may be bonded directly, or indirectly through a linkage group, to the ester bond (—COO—) shown in the formula. Exemplary linkage groups include alkylene groups such as methylene, ethylene, propylene, trimethylene, tetramethylene, and hexamethylene groups (of which alkylene groups having 1 to 6 carbon atoms are preferred).

Representative examples of $R^{24}$ include γ-butyrolactone-2-yl groups which may have one or more substituents (e.g., alkyl groups having 1 to 4 carbon atoms), such as γ-butyrolactone-2-yl group, 3-methyl-γ-butyrolactone-2-yl group, 3,3-dimethyl-γ-butyrolactone-2-yl group, 4-methyl-γ-butyrolactone-2-yl group, 4,4-dimethyl-γ-butyrolactone-2-yl group, 3,4,4-trimethyl-γ-butyrolactone-2-yl group, 3,3,4-trimethyl-γ-butyrolactone-2-yl group, and 3,3,4,4-tetramethyl-γ-butyrolactone-2-yl group; δ-valerolactone-2-yl groups which may have one or more substituents (e.g., alkyl groups having 1 to 4 carbon atoms), such as 5-valerolactone-2-yl group, 3-methyl-δ-valerolactone-2-yl group, 3,3-dimethyl-5-valerolactone-2-yl group, 4-methyl-5-valerolactone-2-yl group, 4,4-dimethyl-δ-valerolactone-2-yl group, 5-methyl-5-valerolactone-2-yl group, and 5,5-dimethyl-δ-valerolactone-2-yl group; ε-caprolactone-2-yl groups which may have one or more substituents (e.g., alkyl groups having 1 to 4 carbon atoms), such as ε-caprolactone-2-yl group, 2-methyl-ε-caprolactone-2-yl group, and 2,2-dimethyl-ε-caprolactone-2-yl group. Of these, preferred are γ-butyrolactone-2-yl groups having one or more (more preferably two) alkyl groups having 1 to 4 carbon atoms; 5-valerolactone-2-yl groups having one or more (more preferably two) alkyl groups having 1 to 4 carbon atoms; and ε-caprolactone-2-yl groups having one or more (more preferably two) alkyl groups having 1 to 4 carbon atoms, of which γ-butyrolactone-2-yl groups having one or more (more preferably two) alkyl groups having 1 to 4 carbon atoms, such as 3,3-dimethyl-γ-butyrolactone-2-yl group, are more preferred.

$M^1$ represents a bivalent organic group having 1 to 6 carbon atoms. Examples of the bivalent organic group include alkylene groups including alkylene groups having 1 to 6 carbon atoms are preferred such as methylene, ethylene, propylene, and butylene; alkenylene groups including alkenylene groups having 2 to 6 carbon atoms, such as vinylene; cycloalkenylene groups such as cyclopentylene and cyclohexylene group; and bivalent organic groups each composed of two or more of these groups bonded to each other through a linkage group such as ether bond (—O—), thioether bond (—S—), or ester bond (—COO—; —COO—). Among them, preferred examples are methylene, ethylene, and propylene. Groups corresponding to the listed groups, except for being substituted by one or more halogen atoms, especially fluorine atoms, are also useful herein.

Representative examples of monomers represented by Formula (2h) (monomers having a lactone skeleton) include 2-(meth)acryloyloxyacetoxy-3-methyl-γ-butyrolactones [i.e., α-(meth)acryloyloxyacetoxy-β-methyl-γ-butyrolactones], 2-(meth)acryloyloxyacetoxy-3,3-dimethyl-γ-butyrolactones [i.e., α-(meth)acryloyloxyacetoxy-β,β-dimethyl-γ-butyrolactones], 2-(meth)acryloyloxyacetoxy-4-methyl-γ-butyrolactones, 2-(meth)acryloyloxyacetoxy-4,4-dimethyl-γ-butyrolactones, 2-(meth)acryloyloxyacetoxy-3-methyl-δ-valerolactones, 2-(meth)acryloyloxyacetoxy-3,3-dimethyl-δ-valerolactones, 2-(meth)acryloyloxyacetoxy-4-methyl-δ-valerolactones, 2-(meth)acryloyloxyacetoxy-4,4-dimethyl-δ-valerolactones, 2-(meth)acryloyloxyacetoxy-5-methyl-δ-valerolactones, 2-(meth)acryloyloxyacetoxy-5,5-dimethyl-δ-valerolactones, 2-(meth)acryloyloxyacetoxy-3-methyl-ε-caprolactones, and 2-(meth)acryloyloxyacetoxy-3,3-dimethyl-ε-caprolactones.

Among these compounds, compounds represented by Formula (2a), Formula (2b), Formula (2c), and Formula (2d) are preferred, of which compounds represented by Formula (2b) are more preferred.

The monomer (c) having a hydroxyl-containing alicyclic skeleton imparts, to the polymer, etching resistance and adhesion to substrates. The alicyclic hydrocarbon group may be a monocyclic hydrocarbon group or polycyclic (bridged) hydrocarbon group. Representative examples of the monomer (c) having a hydroxyl-containing alicyclic skeleton include (meth)acrylic ester monomers represented by Formula (3a). Each of these monomers as the monomer (c) can be used alone or in combination.

In Formula (3a), $R^a$ represents hydrogen atom, a halogen atom, or an alkyl or haloalkyl group having 1 to 6 carbon atoms. Ring $Z^2$ represents a monocyclic or polycyclic alicyclic hydrocarbon ring having 5 to 20 carbon atoms. $R^b$s are substituents bonded to Ring $Z^2$ and each represent a halogen atom, an alkyl or haloalkyl group having 1 to 6 carbon atoms, an alkoxy group having 1 to 6 carbon atoms, hydroxyl group, carboxyl group, or amino group. The number "k" denotes an integer of 1 to 4, wherein, when "k" is 2 or more, the two or more $R^b$s may be the same as or different from each other, and wherein at least one of $kR^b$s is hydroxyl group.

$R^a$ is as described above. As Ring $Z^2$, exemplary monocyclic or polycyclic alicyclic hydrocarbon rings having 5 to 20 carbon atoms include the monocyclic or polycyclic alicyclic hydrocarbon rings having 5 to 20 carbon atoms listed as Ring $Z^1$. Ring $Z^2$ is preferably a polycyclic alicyclic hydrocarbon ring (bridged hydrocarbon ring) and is more preferably adamantane ring. Exemplary halogen atoms and alkyl or haloalkyl groups having 1 to 6 carbon atoms, as $R^b$, include the halogen atoms and alkyl or haloalkyl groups having 1 to 6 carbon atoms listed as $R^a$ above. Exemplary alkoxy groups having 1 to 6 carbon atoms as $R^b$ include methoxy, ethoxy, propoxy, isopropyloxy, butoxy, and hexyloxy groups. When Ring $Z^2$ is a bridged hydrocarbon ring, the hydroxyl group or groups are often bonded at bridgehead positions.

Representative examples of compounds of Formula (3a) include 1-(meth)acryloyloxy-3-hydroxy-5,7-dimethyladamantanes, 1-(meth)acryloyloxy-3-hydroxyadamantanes, and 1-(meth)acryloyloxy-3,5-dihydroxyadamantanes.

[Polymerization Step]

The monomer to be subjected to polymerization has only to be one of the monomers (a), (b), and (c), but is preferably a monomer mixture containing two or more of the three types of monomers, and more preferably a monomer mixture containing all the three types of monomers. Where necessary, one or more other monomers are subjected to the polymerization (copolymerization) with at least one of the monomers (a), (b), and (O). The polymerization can be performed according to a common procedure such as solution polymerization or melt polymerization.

One or more solvents for use in the polymerization have only to be solvents generally used in the polymerization of acrylic monomers and/or olefinic monomers, such as glycol solvents, ester solvents, ketone solvents, ether solvents, and mixtures of these solvents. Exemplary glycol solvents include propylene glycol solvents such as propylene glycol monomethyl ether and propylene glycol monomethyl ether acetate; and ethylene glycol solvents such as ethylene glycol monomethyl ether, ethylene glycol monomethyl ether acetate, ethylene glycol monoethyl ether, ethylene glycol monoethyl ether acetate, ethylene glycol monobutyl ether, and ethylene glycol monobutyl ether acetate. Exemplary ester solvents include lactic ester solvents such as ethyl lactate; propionic ester solvents such as methyl 3-methoxypropionate; and acetic ester solvents such as methyl acetate, ethyl acetate, propyl acetate, and butyl acetate. Exemplary ketone solvents include acetone, methyl ethyl ketone, methyl isobutyl ketone, methyl amyl ketone, and cyclohexanone. Exemplary ether solvents include diethyl ether, diisopropyl ether, dibutyl ether, tetrahydrofuran, and dioxane.

Preferred examples of such polymerization solvents include glycol solvents such as propylene glycol monomethyl ether and propylene glycol monomethyl ether acetate; ester solvents such as ethyl lactate; ketone solvents such as methyl isobutyl ketone and methyl amyl ketone; and mixtures of these solvents. Among them, more preferred are solvents containing at least propylene glycol monomethyl ether acetate, such as propylene glycol monomethyl ether acetate alone; solvent mixtures containing both propylene glycol monomethyl ether acetate and propylene glycol monomethyl ether; and solvent mixtures containing both propylene glycol monomethyl ether acetate and ethyl lactate.

The polymerization is preferably performed according to dropping polymerization. The dropping polymerization is a technique in which polymerization is performed while a monomer (solution) and/or a polymerization initiator (solution) is sequentially added dropwise or sequentially added to the system. The dropping polymerization gives a polymer having a copolymerization composition being uniform during a duration from early stages to later stages of the polymerization. One or more known polymerization initiators can be used as the polymerization initiator. The polymerization is performed at temperatures of, for example, about 40° C. to 150° C., and preferably about 60° C. to 100° C.

The resulting polymerization reaction mixture (polymer dope) may be subjected to a filtration step to remove insoluble matter. The pore diameter of a filter medium for use in the filtration is typically 1 µm or less, and preferably 0.1 µm or less.

[Extraction Step]

In an embodiment of the present invention, a polymer formed through polymerization may be subjected to an extraction treatment using an organic solvent and water to distribute or divide the formed polymer to an organic solvent layer, and metal components as impurities to an aqueous layer, before the polymer is sequentially passed through the two filters including porous membranes having ion-exchange groups. The extraction treatment is a kind of washing (water washing). The extraction step efficiently removes metal components, which adversely affect the performance of resists, from the polymer. A material to be subjected to the extraction step is not limited, as long as being a polymer formed through polymerization or a solution containing the polymer. The material can for example be any of a polymerization reaction mixture (polymer solution; polymer dope) at the completion of the polymerization, or a solution obtained from the polymerization reaction mixture through an adequate treatment such as dilution, concentration, filtration, and/or cleaning. The organic solvent can be any solvent, as long as capable of dissolving the polymer therein and capable of separating from water. The amounts of the organic solvent and water can be chosen within such ranges that the organic solvent layer is separable from the aqueous layer.

In a preferred embodiment, the polymerization reaction mixture obtained from the polymerization step is combined with water and an organic solvent having a specific gravity of 0.95 or less (preferably further having a solubility parameter (SP) of 20 $MPa^{1/2}$ or less) to perform extraction (washing). In another preferred embodiment, a solution of the polymer obtained through the polymerization in a glycol or ester solvent is combined with water and an organic solvent having a specific gravity of 0.95 or less and a solubility parameter (SP) of 20 $MPa^{1/2}$ or less, to perform extraction (washing). The specific gravity of the organic solvent may be a value determined at 20° C. to 25° C. The solubility parameter (SP) of the organic solvent can be determined, for example, according to the method described in VII-675 to VII-711 [particularly according to Equations (B3) and (B8) in 676], Polymer Handbook, 4th ed. (edited by J. Brandrup. E. H. Immergut, E. A. Grulke), John Wiley&Sons, New York, 1999. Alternatively, solubility parameters (SP) of some organic solvents can be found in Table 1 (VII-683), and Table 7 and Table 8 (VII-688 to VII-711) of this document.

The solution of the polymer formed through polymerization in a glycol or ester solvent may be a polymerization reaction mixture (polymer dope) at the completion of the polymerization, or a solution obtained from the polymerization reaction mixture through an adequate treatment such as dilution, concentration, filtration, and/or cleaning. Examples of the glycol solvent and ester solvent are as listed above.

Glycol solvents, such as propylene glycol monomethyl ether acetate, and ester solvents, such as ethyl lactate, are difficult to be separated from water, because they have specific gravities near to that of water (near to 1). However, when a polymer solution containing such a glycol or ester solvent is combined with an organic solvent having a specific gravity of 0.95 or less and a solubility parameter SP of 20 MPa$^{1/2}$ or less (e.g., 13 to 20 MPa$^{1/2}$, the resulting organic layer can be very easily separated from an aqueous layer. If an organic solvent having a specific gravity of more than 0.95 is added, the organic layer may not be satisfactorily separated from the aqueous layer, because the organic solvent does not have a specific gravity sufficiently different from that of water to be added. If an organic solvent having a solubility parameter SP of more than 20 MPa$^{1/2}$ is added, the resulting organic layer may not be satisfactorily separated from the aqueous layer, because the organic solvent shows high miscibility with water. The specific gravity of the organic solvent to be added is preferably from 0.6 to 0.95, more preferably from 0.7 to 0.85, and especially preferably from 0.7 to 0.82. The solubility parameter SP of the organic solvent to be added is preferably from 16 to 19 MPa$^{1/2}$, more preferably from 16.5 to 18.5 MPa$^{1/2}$, and especially preferably from 16.5 to 18 MPa$^{1/2}$.

Representative examples of organic solvents having a specific gravity of 0.95 or less and a solubility parameter SP of 20 MPa$^{1/2}$ or less include aliphatic hydrocarbons such as hexane (specific gravity of 0.659 and SP of 14.9), octane (specific gravity of 0.703 and SP of 15.6), and dodecane (specific gravity of 0.749 and SP of 16.2); alicyclic hydrocarbons such as cyclohexane (specific gravity of 0.779 and SP of 16.8); aromatic hydrocarbons such as ethylbenzene (specific gravity of 0.862 and SP of 18.0), p-xylene (specific gravity of 0.857 and SP of 18.0), toluene (specific gravity of 0.867 and SP of 18.2), and benzene (specific gravity of 0.874 and SP of 18.8); ethers such as diisopropyl ether (specific gravity of 0.726 and SP of 14.1); ketones such as diisobutyl ketone (specific gravity of 0.806 and SP of 16.0), methyl isobutyl ketone (specific gravity of 0.796 and SP of 17.2), methyl propyl ketone (specific gravity of 0.809 and SP of 17.8), methyl isopropyl ketone (specific gravity of 0.803 and SP of 17.4), methyl ethyl ketone (specific gravity of 0.805 and SP of 19.0), and methyl amyl ketone (specific gravity of 0.815 and SP of 17.6); and esters such as isopropyl acetate (specific gravity of 0.872 and SP of 17.2), butyl acetate (specific gravity of 0.881 and SP of 17.4), and propyl acetate (specific gravity of 0.889 and SP of 18.0). The specific gravity data in the parentheses are values at 20° C., except that the data of benzene, p-xylene, ethylbenzene, and methyl isobutyl ketone are values at 25° C.; and the solubility parameters SPs are indicated in units of MPa$^{1/2}$.

Of these solvents, preferred are ketones such as diisobutyl ketone, methyl isobutyl ketone, methyl propyl ketone, methyl isopropyl ketone, and methyl amyl ketone.

The amount of organic solvents having a specific gravity of 0.95 or less and a solubility parameter SP of 20 MPa$^{1/2}$ or less can be chosen as appropriate in consideration typically of extraction efficiency and operability, but is generally about 10 to 300 parts by weight, and preferably about 20 to 200 parts by weight, per 100 parts by weight of the polymer solution in a glycol or ester solvent. The amount of water can also be chosen as appropriate in consideration typically of extraction efficiency and operability, but is generally about 5 to 300 parts by weight, and preferably about 10 to 200 parts by weight, per 100 parts by weight of the total of the organic solvent and the polymer solution in a glycol or ester solvent.

The water to be used in the extraction can be water to be used in a washing treatment step mentioned below.

The extraction (washing) operation can be performed according to a common procedure and may be performed according to any of a batch system, semi-batch system, and continuous system. The extraction treatment may be repeated multiple times (e.g., about 2 to 10 times). The extraction temperature can be chosen as appropriate in consideration typically of operability and solubility and is, for example, about 0° C. to 100° C., and preferably about 25° C. to 50° C.

The resulting organic solvent layer may be subjected to a filtration step to remove insoluble matter therefrom. The pore diameter of a filter medium for use in the filtration is, for example, 1 μm or less, preferably 0.5 μm or less, and more preferably 0.1 μm or less.

[Filter-Passing Step]

In an embodiment of the present invention, a solution containing a polymer formed through polymerization (this polymer is hereinafter also referred to as "polymer P") is first passed through a filter including a porous membrane having an anion-exchange group, and thereafter passed through a filter including a porous membrane having a cation-exchange group. The polymer solution, when passed through the specific two porous membrane filters in this order, can give a polymer which is remarkably reduced in content of metals, and especially remarkably reduced not only in sodium content but also in iron content. This is probably because both metal cations and metal anions are efficiently adsorbed by the filters. Contrarily, if the polymer solution is first passed through a filter including a porous membrane having a cation-exchange group and thereafter passed through a filter including a porous membrane having an anion-exchange group, metals components, especially sodium, may not sufficiently removed, thus being undesirable.

The polymer P has only to contain one selected from a repeating unit corresponding to the monomer (a), a repeating unit corresponding to the monomer (b), and a repeating unit corresponding to the monomer (c), but preferably contains two or more of the three repeating units [for example, at least a repeating unit corresponding to the monomer (a) and a repeating unit corresponding to the monomer (b)] and more preferably contains the three repeating units. The polymer P may further contain one or more other repeating units according to necessity.

The polymer P can be synthetically prepared by the technique described in the polymerization step. More specifically, the polymer P can be synthesized by subjecting at least one monomer (e.g., acrylic monomer and/or olefinic monomer) selected from the group consisting of a monomer having a group capable of leaving with an acid to allow the polymeric compound to be soluble in an alkali, a monomer having a lactone skeleton, and a monomer having a hydroxyl-containing alicyclic skeleton, and, where necessary, one or more other monomers to polymerization (radical polymerization). The polymerization can be performed according to a common procedure such as solution polymerization or melt polymerization. The monomer or monomer mixture for use herein is preferably one having a low metal content of, for example, 100 parts per billion by weight or less.

Exemplary solvents for use in the solution containing the polymer P include, but are not limited to, esters such as ethyl acetate, butyl acetate, propylene glycol monomethyl ether monoacetate, ethyl lactate, and ethyl benzoate; ketones such as acetone, ethyl methyl ketone, diethyl ketone, isobutyl methyl ketone, and t-butyl methyl ketone; chain or cyclic ethers such as diethyl ether, diisopropyl ether, t-butyl methyl ether, dibutyl ether, dimethoxyethane, propylene glycol monomethyl ether, anisole, dioxane, and tetrahydrofuran; alcohols such as methanol, ethanol, isopropyl alcohol, and butanol; nitriles such as acetonitrile, propionitrile, and benzonitrile; aromatic hydrocarbons such as benzene, toluene, xylenes, and ethylbenzene; aliphatic hydrocarbons such as hexane, heptane, and octane; alicyclic hydrocarbons such as cyclohexane; halogenated hydrocarbons such as dichloromethane, 1,2-dichloroethane, and chlorobenzene; amides such as N,N-dimethylformamide; carbon disulfide; water; and mixtures of these solvents. Among them, preferred are esters, ketones, and mixtures containing any of esters and ketones. The solvent may be a polymerization solvent or a solvent replaced from the polymerization solvent.

Examples of the anion-exchange group in the "filter including a porous membrane having an anion-exchange group" include anion-exchange groups (basic anion-exchange groups) such as quaternary ammonium group. Though not limited, examples of the porous membrane include porous polyolefin membranes, porous fluorocarbon resin membranes, and porous polyimide membranes. Among them, porous polyolefin membranes are preferred. Exemplary polyolefins to constitute such polyolefin membranes include polyethylenes such as high-density polyethylenes; and polypropylenes.

The filter including a porous membrane having an anion-exchange group is preferably one having hydrophilicity, such as a product supplied under the trade name "IonKleen (registered trademark) AN Purifier" (porous polyolefin membrane) by Pall Corporation.

Examples of the cation-exchange group in the "filter including a porous membrane having a cation-exchange group" include strongly acidic cation-exchange groups such as sulfonic group; and weakly acidic cation-exchange groups such as carboxyl group. Though not limited, examples of the porous membrane herein include porous polyolefin membranes, porous fluorocarbon resin membranes, and porous polyimide membranes. Among them, porous polyolefin membranes are preferred. Exemplary polyolefins for constituting such polyolefin membranes include polyethylenes such as high-density polyethylenes; and polypropylenes.

The filter including a porous membrane having a cation-exchange group is preferably one having hydrophilicity, such as a product supplied under the trade name "IonKleen (registered trademark) SL Purifier" (porous polyolefin membrane) by Pall Corporation.

When a solution containing the polymer P (photoresist polymeric compound) is passed through the filter including a porous membrane having a cation-exchange group to remove metal ions, hydrogen ions (acids) are stoichiometrically generated. The smaller the amount of hydrogen ions is, the better, because the hydrogen ions render an acid-leaving group (group capable of leaving with an acid) of the polymer P to leave to thereby impair the performance of resists. Accordingly, the metal content of the solution containing the polymer P before passing through the filter including a porous membrane having a cation-exchange group (or the metal content of a solution containing the polymer P in the previous step, i.e., before passing through the filter including a porous membrane having an anion-exchange group) is desirably 1000 parts per billion by weight or less (e.g., 10 to 1000 parts per billion by weight), preferably 800 parts per billion by weight or less (e.g., 10 to 800 parts per billion by weight), more preferably 500 parts per billion by weight or less (e.g., 10 to 500 parts per billion by weight), and especially preferably 350 parts per billion by weight or less (e.g., 10 to 350 parts per billion by weight), relative to the weight of the polymer P. If the solution containing the polymer P has a high metal content, the resulting solution after passing through the filter may have a high hydrogen ion concentration, and this may impair the performance of the resist.

The flow rates of the solution containing the polymer P passing through the two filters (the filter including a porous membrane having an anion-exchange group, and the filter including a porous membrane having a cation-exchange group) may vary respectively according typically to the type of material of the porous membrane and the type of the solution (solvent) and can be set as appropriate within such a range as not to impair the removal efficiency of metals. The flow rates are, for example, about 50 milliliters per minute to 100 liters per minute. The filter-passing is performed at a temperature ranging generally about 0° C. to 80° C., and preferably about 10° C. to 50° C. Filter-passing, if performed at an excessively high temperature, may typically cause deterioration of the filter and/or decomposition of the solvent. In contrast, filter-passing, if performed at an excessively low temperature, may cause the solution to have an excessively high viscosity, and such a viscous solution may often become resistant to passing through the filter.

By passing the solution containing the polymer P sequentially through the two filters, metal ions such as sodium ion and iron ion are efficiently removed from the solution to give a polymer solution having a content of metals of typically 40 parts per billion by weight or less, preferably 30 parts per billion by weight or less, and more preferably 20 parts per billion by weight or less, relative to the weight of the polymer. Specifically, the resulting polymer solution may have a sodium content and an iron content each of 15 parts per billion by weight or less, and preferably 10 parts per billion by weight or less, relative to the weight of the polymer. Accordingly, the resulting polymer P, when used as a resin component of a photoresist resin composition, does not adversely affect the electrical properties typically of semiconductor devices.

[Precipitation/Purification Step]

In an embodiment of the present invention, a polymer formed through polymerization may be subjected to a precipitation/purification step before or after the filter-passing step. In the precipitation/purification step, the polymer formed through polymerization is precipitated or reprecipitated. The precipitation/purification step efficiently removes raw-material monomers, oligomers, and other unnecessary substances from the polymer. A solution to be subjected to the precipitation/purification treatment has only to be a solution containing a polymer formed through polymerization and can be any of a polymerization reaction mixture (polymer dope) at the completion of the polymerization, and a solution obtained from the polymerization reaction mixture through an adequate treatment such as dilution, concentration, filtration, cleaning (washing), and/or extraction. The solution to be subjected to the precipitation/purification treatment is preferably an organic solvent layer obtained from the extraction step, or a solution obtained from the organic solvent layer through a filtration treatment.

A solvent for use in precipitation or reprecipitation (precipitation solvent) is not limited, as long as being a poor solvent for the polymer. Exemplary solvents usable herein include hydrocarbons including aliphatic hydrocarbons (e.g., pentane, hexane, heptane, and octane), alicyclic hydrocarbons (e.g., cyclohexane and methylcyclohexane), and aromatic hydrocarbons (e.g., benzene, toluene, and xylenes); halogenated hydrocarbons including halogenated aliphatic hydrocarbons (e.g., methylene chloride, chloroform, and carbon tetrachloride) and halogenated aromatic hydrocarbons (e.g., chlorobenzene and dichlorobenzene); nitro compounds such as nitromethane and nitroethane; nitriles such as acetonitrile and benzonitrile; ethers including chain ethers (e.g., diethyl ether, diisopropyl ether, and dimethoxyethane) and cyclic ethers (e.g., tetrahydrofuran and dioxane); ketones such as acetone, methyl ethyl ketone, methyl isobutyl ketone, and diisobutyl ketone; esters such as ethyl acetate and butyl acetate; carbonates such as dimethyl carbonate, diethyl carbonate, ethylene carbonate, and propylene carbonate; alcohols such as methanol, ethanol, propanol, isopropyl alcohol, and butanol; carboxylic acids such as acetic acid; water; and solvent mixtures containing any of these solvents.

Among these solvents, preferred as the precipitation solvent are solvent mixtures containing at least a hydrocarbon, of which more preferred are solvent mixtures containing at least an aliphatic hydrocarbon such as hexane or heptane. The mixing ratio between hydrocarbons and other solvents (e.g., esters such as ethyl acetate) in such a solvent mixture containing at least a hydrocarbon is such that the ratio of the hydrocarbon to the other solvent is, for example, about 10:90 to 99:1 (volume ratio at 25° C.; hereinafter the same), preferably about 30:70 to 98:2, and more preferably about 50:50 to 97:3.

In a preferred embodiment in this step, a solution containing the polymer formed through polymerization in a glycol or ester solvent is added to a solvent containing at least a hydrocarbon to precipitate or reprecipitate the polymer. The solution containing the polymer formed through polymerization in a glycol or ester solvent may be, for example, an organic solvent layer containing a glycol or ester solvent obtained from the extraction step, or a solution obtained from the organic solvent layer through a filtration treatment.

The precipitation/purification treatment (operation) may be performed multiple times. In this case, solvents for use in respective treatments may be the same as or different from each other. When the multiple precipitation/purification treatments are performed using different solvents, it is preferred to perform a precipitation/purification treatment using a solvent mixture containing at least a hydrocarbon (e.g., a solvent mixture containing a hydrocarbon and an ester) in combination with a precipitation/purification treatment using one or more other solvents such as an alcohol (e.g., methanol), or a solvent mixture containing an alcohol. Of the hydrocarbons herein, aliphatic hydrocarbons such as hexane and heptane are preferred.

[Repulping Step]

In an embodiment of the present invention, a polymer formed through polymerization may be subjected to a repulping step before or after the filter-passing step. In the repulping step, the polymer formed through polymerization is repulped with a solvent. This step, when performed, efficiently removes residual monomers, low-molecular-weight oligomers, and other unnecessary substances attached to the polymer. In addition, this step helps to avoid problems such as hardening of surfaces of polymer particles, and fusion of the polymer particles in subsequent steps such as drying step, probably because the step removes a high-boiling solvent having an affinity to the polymer. The resulting polymer thereby has a remarkably improved solubility in a resist solvent, and this enables easy and efficient preparation of a photoresist resin composition.

A material to be subjected to the repulping treatment is, for example, the precipitated/purified polymer (e.g., a polymer after the precipitation/purification, from which the solvent has been removed typically through decantation or filtration).

The solvent for use in the repulping treatment (repulping solvent) is preferably any of poor solvents for the polymer, for use in the precipitation or reprecipitation. Among such poor solvents, hydrocarbon solvents are more preferred. Exemplary hydrocarbon solvents include aliphatic hydrocarbons such as pentane, hexane, heptane, and octane; alicyclic hydrocarbons such as cyclohexane and methylcyclohexane; and aromatic hydrocarbons such as benzene, toluene, and xylenes. Each of different solvents may be used in combination. Among them, aliphatic hydrocarbons are preferred, of which hexane or heptane, or a solvent mixture containing hexane or heptane is more preferred.

The amount of repulping solvents is typically about 1 to 200 times by weight, preferably about 5 to 100 times by weight, and more preferably about 10 to 50 times by weight, relative to the weight of the polymer. Though varying depending typically on the type of the solvent used, a temperature at which the repulping treatment is performed is generally about 0° C. to 100° C., and preferably about 10° C. to 60° C. The repulping treatment may be performed in a suitable vessel.

The repulping treatment may be performed multiple times. In this case, solvents for use in respective repulping treatments may be the same as or different from each other. When multiple repulping treatments are performed using different solvents, it is preferred to perform a repulping treatment using a solvent mixture containing at least a hydrocarbon (e.g., a solvent mixture containing a hydrocarbon and an ester) in combination with a repulping treatment using one or more other solvents such as an alcohol (e.g., methanol), or a solvent mixture containing an alcohol. Of the hydrocarbons herein, aliphatic hydrocarbons such as hexane and heptane are preferred.

A liquid after treatment (repulping liquid) is removed typically through decantation.

[Rinsing Step]

In an embodiment of the present invention, a polymer formed through polymerization may be subjected to a rinsing step before or after the filter-passing step. In the rinsing step, the polymer formed through polymerization is rinsed with a solvent. This step, as with the repulping step, efficiently removes unnecessary substances, such as residual monomers and low-molecular-weight oligomers, attached to the polymer. In addition, this step helps to avoid problems such as hardening of surfaces of polymer particles, and fusion of the polymer particles in subsequent steps such as drying step, probably because the step removes a high-boiling solvent having an affinity to the polymer. The resulting polymer thereby has a remarkably improved solubility in a resist solvent, and this enables easy and efficient preparation of a photoresist resin composition. Furthermore, this step, when using water as the rinsing solvent, efficiently removes metal components attached to the surface of the polymer and thereby significantly prevent the resist from deterioration in performance due to such metal components.

A material to be subjected to the rinsing treatment may for example be the precipitated/purified polymer (e.g., a polymer after the precipitation/purification, from which the solvent has been removed typically through decantation) or the polymer after the repulping treatment (e.g., a polymer after the repulping treatment, from which the solvent has been removed typically through decantation).

The solvent for use in the rinsing treatment (rinsing solvent) is preferably any of poor solvents for the polymer, for use in the precipitation or reprecipitation. Among them, hydrocarbon solvents are more preferred. Exemplary hydrocarbon solvents include aliphatic hydrocarbons such as pentane, hexane, heptane, and octane; alicyclic hydrocarbons such as cyclohexane and methylcyclohexane; and aromatic hydrocarbons such as benzene, toluene, and xylenes. Each of different solvents may be used in combination. Among them, aliphatic hydrocarbons are preferred, of which hexane or heptane, or a solvent mixture containing hexane or heptane is more preferred. To remove metal components from the polymer, preferred as the rinsing solvent is water, of which more preferred is ultrapure water or another water having a sodium content of 5 parts per billion by weight or less, preferably 3 parts per billion by weight or less, and more preferably 1.5 parts per billion by weight or less.

The amount of rinsing solvents is typically about 1 to 100 times by weight, and preferably about 2 to 20 times by weight, relative to the weight of the polymer. Though varying depending typically on the type of solvent used, a temperature at which the rinsing treatment is performed is generally about 0° C. to 100° C., and preferably about 10° C. to 60° C. The rinsing treatment may be performed in a suitable vessel. The rinsing treatment may be performed multiple times. Above all, it is preferred to perform a rinsing treatment with a hydrocarbon solvent in combination with a rinsing treatment with water. A liquid after the treatment (rinsing liquid) is removed typically through decantation or filtration.

[Drying Step]

In an embodiment of the present invention, a photoresist polymeric compound may be produced through a drying step. The drying step is performed after passing a polymer formed through polymerization through the two filters including porous membranes having ion-exchange groups; subjecting the polymer to precipitation/purification; and, where necessary, subjecting the polymer to a repulping treatment and/or a rinsing treatment, as described above. In the drying step, the resulting polymer is dried. A drying temperature of the polymer is typically about 20° C. to 120° C., and preferably about 30° C. to 80° C. The drying is preferably performed under reduced pressure typically of 200 mmHg (26.6 kPa) or less, and more preferably of 100 mmHg (13.3 kPa) or less.

[Redissolving Step]

In an embodiment of the present invention, a photoresist polymeric compound may be produced through a redissolving step. The redissolving step is performed after passing a polymer formed through polymerization through the two filters including porous membranes having ion-exchange groups; subjecting the polymer to precipitation/purification; and, where necessary, subjecting the polymer to one or more of resulting treatment, rinsing treatment, and drying treatment. In the redissolving step, the polymer is redissolved in an organic solvent (resist solvent) to give a polymer solution. The polymer solution is usable as a photoresist polymer solution. The photoresist polymer solution may have a polymer concentration of about 10 to 40 percent by weight. Examples of the organic solvent include the glycol solvents, ester solvents, ketone solvents, and mixtures of these solvents, listed as the polymerization solvents. Among them, preferred are propylene glycol monomethyl ether, propylene glycol monomethyl ether acetate, ethyl lactate, methyl isobutyl ketone, methyl amyl ketone, and mixtures of them, of which more preferred are solvents containing at least propylene glycol monomethyl ether acetate, such as propylene glycol monomethyl ether acetate alone; a solvent mixture containing propylene glycol monomethyl ether acetate and propylene glycol monomethyl ether; and a solvent mixture containing propylene glycol monomethyl ether acetate and ethyl lactate.

[Evaporating Step]

In an embodiment of the present invention, a photoresist polymeric compound may be produced through a evaporating step. The evaporating step concentrates the polymer solution prepared from the redissolving step, to distill off low-boiling-point solvents (e.g., solvents used as the polymerization solvent, extraction solvent, precipitation solvent, repulping solvent, and/or rinsing solvent) from the polymer solution to thereby prepare a photoresist polymer solution. The evaporating step is useful when the polymer solution prepared from a redissolving step contains one or more low-boiling-point solvents typically in the case where the redissolving step is performed without performing a drying step. When the evaporating step is provided, an organic solvent (resist solvent) in an amount equal to or more than a necessary amount for the preparation of a photoresist polymer solution is used in the redissolving step to give a polymer solution, and the polymer solution is concentrated to a desired polymer concentration (e.g., about 10 to 40 percent by weight) in the evaporating step. The concentration may be performed under normal atmospheric pressure or under reduced pressure.

The photoresist polymer solution is further combined with a photosensitive acid generator, and according to necessity, various additives, and is then used for the production of semiconductor devices.

[Filtration Step]

In an embodiment of the present invention, a filtration step may be provided before the filter-passing step. The filtration step removes insoluble matter by filtrating a solution containing the polymer P. The filtration step, when provided, prevents clogging in the filter-passing step and prevents troubles in patterning using the photoresist resin composition, which troubles are caused by contamination of foreign substances into the photoresist resin.

Though not limited, a filter medium for use in the filtration step is generally typically a membrane filter. The pore diameter of the filter medium is generally about 0.01 to 10 µm, preferably about 0.02 to 1 µm, and more preferably about 0.02 to 0.3 µm.

[Washing Treatment Step]

In another embodiment of the present invention, a washing treatment (water washing treatment) step may be provided before the filter-passing step. The washing treatment step washes a solution containing the polymer P with water to reduce a content of metals of the solution. The washing treatment step, when provided before the filter-passing step, gives great advantages. Specifically, a load on the filter-passing step can be reduced because the washing treatment step efficiently removes water-soluble metallic compounds. In addition, this step contributes to the reduction of amount of hydrogen ions formed with the removal of metal ions in the filter-passing step, and this in turn protects the resulting resist from deterioration in performance. Particularly when the solution containing the polymer P has a content of metals of more than 1000 parts per billion by weight, the washing treatment step allows the solution to have a content of metals of 1000 parts per billion by weight or less before subjected to the filter-passing step.

The water for use in the washing treatment step is preferably one having a low metal content, such as ultrapure water having a content of metals of 1 part per billion by weight or less. The amount of water is typically about 10 to 1000 parts by weight, and preferably about 30 to 300 parts by weight, per 100 parts by weight of the liquid (solution) to be treated. A temperature at which the washing treatment is performed is, for example, about 10° C. to 50° C.

When both the filtration step and the washing treatment step are provided, the order of the two steps is not restricted, but the filtration step is generally performed before the washing treatment step.

In an embodiment of the present invention, a step of subjecting a solution containing the polymer P to another adsorption treatment may be performed according to necessity, in addition to the above-mentioned steps. Examples of the other adsorption treatment include treatment with a activated carbon, treatment with a chelate resin, treatment with a chelate fiber, and treatment with a zeta potential membrane.

A solution containing the polymer P (photoresist polymeric compound) after the above-mentioned steps is used for the preparation of a photoresist resin composition as intact or after the isolation of the polymer typically through precipitation or reprecipitation.

A solvent for use in the precipitation or reprecipitation (precipitation solvent) has only to be a poor solvent for the polymer, and examples of such solvents usable herein include hydrocarbons including aliphatic hydrocarbons (e.g., pentane, hexane, heptane, and octane), alicyclic hydrocarbons (e.g., cyclohexane and methylcyclohexane), and aromatic hydrocarbons (e.g., benzene, toluene, and xylenes); halogenated hydrocarbons including halogenated aliphatic hydrocarbons (e.g., methylene chloride, chloroform, and carbon tetrachloride), and halogenated aromatic hydrocarbons (e.g., chlorobenzene and dichlorobenzene); nitro compounds such as nitromethane and nitroethane; nitriles such as acetonitrile and benzonitrile; ethers including chain ethers (e.g., diethyl ether, diisopropyl ether, and dimethoxyethane), and cyclic ethers (e.g., tetrahydrofuran and dioxane); ketones such as acetone, methyl ethyl ketone, methyl isobutyl ketone, and diisobutyl ketone; esters such as ethyl acetate and butyl acetate; carbonates such as dimethyl carbonate, diethyl carbonate, ethylene carbonate, and propylene carbonate; alcohols such as methanol, ethanol, propanol, isopropyl alcohol, and butanol; carboxylic acids such as acetic acid; water; and solvent mixtures containing any of these solvents. Of such solvents, preferred as the precipitation solvent are solvent mixtures containing at least a hydrocarbon, of which more preferred are solvent mixtures containing at least an aliphatic hydrocarbon such as hexane or heptane. The mixing ratio between hydrocarbons and other solvents (e.g., esters such as ethyl acetate) in such a solvent mixture containing at least a hydrocarbon is such that the ratio of the hydrocarbon to the other solvents is, for example, about 10:90 to 99:1 (volume ratio at 25° C.; hereinafter the same), preferably about 30:70 to 98:2, and more preferably about 50:50 to 97:3. The precipitation solvent is preferably one having a low content of metals, such as one having a content of metals of 50 parts per billion by weight or less.

A process for producing a photoresist polymeric compound, according to an embodiment of the present invention, can efficiently remove metal components, especially sodium and iron, adversely affecting the electrical properties typically of semiconductor devices, and thereby give a polymeric compound which in turn gives a resist of desired performance when used as a resin component for a photoresist resin composition. The process, when further including both the polymerization step and extraction step, can further efficiently produce a photoresist polymeric compound which is easily and reliably dissolved in a resist solvent.

The resulting photoresist polymeric compound is combined with a photosensitive acid generator, and, according to necessity, one or more additives and solvents to give a photoresist resin composition. The photoresist resin composition is used to form a photosensitive layer, and the photosensitive layer is exposed, developed, and thereby patterned to produce a semiconductor device. The preparation of the photoresist resin composition, and the formation, exposure, and development of the photosensitive layer can be performed according to common procedures, respectively.

EXAMPLES

The present invention will be illustrated in further detail with reference to several working examples below. It should be noted, however, that these examples are never construed to limit the scope of the present invention. Numerals at lower light of the parentheses in the structural formulae in Examples 1, 3, 4, 5, and 6 each indicate "percent by mole" of the monomer unit (repeating unit) in question. Monomers each having a content of metals of 100 parts per billion by weight or less were used in Examples 1 to 6, and Comparative Examples 1 and 2. Regarding propylene glycol monomethyl ether acetate (PGMEA) and methyl isobutyl ketone (MIBK), commercial products were subjected to distillation in a glass distillator to have a content of metals of 50 parts per billion by weight or less, before used in Example 1 and Comparative Example 1. In contrast, the commercial products were used without any treatment in the examples and comparative examples other than Example 1 and Comparative Example 1. In Examples 1 to 6, and Comparative Examples 1 and 2, solvents (ethyl acetate, hexane) used in the precipitation treatment and repulping treatment had been subjected to distillation in a glass distillator to have a content of metals of 50 parts per billion by weight or less before use; and ultrapure water was used as the water, which ultrapure water had been prepared by subjecting pure water to an ion-exchange treatment and thereafter to a membrane treatment to have a content of metals of 1 part per billion by weight or less. The metal contents were determined with an inductively coupled plasma-mass spectrometer (ICP-MS) and are indicated as values (ppb) relative to the amounts of the ultimately obtained polymers. The "ppb" herein is by weight (part per billion by weight).

Example 1

Production of Photoresist Polymeric Compound with Following Structure

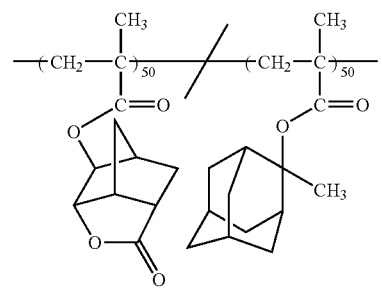

In a reactor equipped with a stirrer, a thermometer, a reflux condenser, a dropping tube, and a nitrogen inlet tube, was placed 70 g of propylene glycol monomethyl ether acetate (PGMEA). After elevating the temperature to 100° C., a solution mixture was added dropwise over 6 hours. The solution mixture was a solution containing 73.0 g of 5-methacryloyloxy-2,6-norbornanecarbolactone (MNBL) (metal content of 100 ppb or less), 77.0 g of 2-methacryloyloxy-2-methyladamantane (2-MMA), and 1.8 g of azobisisobutyronitrile in 530 g of PGMEA. After the completion of dropwise addition, the resulting mixture was aged for 2 hours and thereby yielded a polymer solution containing 20 percent by weight of a polymeric compound represented by the above formula. The polymer solution was filtrated through a membrane filter having a pore diameter of 0.5 μm, and the filtrate was combined with 750 g of methyl isobutyl ketone (MIBK). The polymer solution at this stage had a content of metals of 450 ppb.

The polymer solution was first passed through "IonKleen AN Purifier" (trade name; supplied by Pall Corporation, made from a polypropylene, with a filtration area of 0.093 m$^2$) including a porous polyolefin membrane having an anion-exchange group. This was performed at room temperature and a flow rate of 100 grams per minute. Next, the resulting solution was passed through "IonKleen SL Purifier" (trade name; supplied by Pall Corporation, made from a chemically modified ultrahigh-molecular-weight polyethylene, with a filtration area of 0.11 m$^2$) including a porous polyolefin membrane having a cation-exchange group. This was performed at room temperature and a flow rate of 100 grams per minute.

The resulting solution was poured into a solvent mixture containing 6750 g of hexane and 2250 g of ethyl acetate to give precipitates, and the precipitates were repulped with 6500 g of hexane. After removing the supernatant, the residue was transferred to a centrifugal separator, followed by centrifugation to give a wet polymer. The wet polymer was taken out from the centrifugal separator, dried at 50° C. and 20 mmHg (2.66 kPa) for 30 hours, and thereby yielded 108 g of a product polymer. The product polymer had, as content of metals, a sodium (Na) content of 3 ppb, an iron (Fe) content of 3 ppb, and a total metal content of 10 ppb.

Comparative Example 1

A product polymer (105 g) was obtained by the procedure of Example 1, except for passing the polymer solution through "IonKleen SL Purifier" (trade name; supplied by Pall Corporation, made from a chemically modified ultrahigh-molecular-weight polyethylene, with a filtration area of 0.11 m$^2$) including a porous polyolefin membrane having a cation-exchange group. This was performed at room temperature and a flow rate of 100 grams per minute, without passing the solution through a filter including a porous polyolefin membrane having an anion-exchange group. The product polymer had, as content of metals, a sodium (Na) content of 5 ppb, an iron (Fe) content of 20 ppb, and a total metal content of 50 ppb.

Example 2

A polymer solution was obtained through polymerization by the procedure of Example 1, except for using a commercially available PGMEA as intact. The polymer solution was passed through a membrane filter having a pore diameter of 0.5 μm, and combined with 750 g of a commercially available methyl isobutyl ketone (MIBK). The polymer solution at this stage had a content of metals of 1200 ppb.

The polymer solution was then subjected to a washing treatment by adding 1500 g of water (ultrapure water), stirring, and separating the mixture into an organic layer and an aqueous layer. The organic layer at this stage had a content of metals of 250 ppb. The organic layer was first passed through "IonKleen AN Purifier" (trade name; supplied by Pall Corporation, made from a polypropylene, with a filtration area of 0.093 m$^2$) including a porous polyolefin membrane having an anion-exchange group. This was performed at room temperature and a flow rate of 100 grams per minute. The solution was thereafter passed through "IonKleen SL Purifier" (trade name; supplied by Pall Corporation, made from a chemically modified ultrahigh-molecular-weight polyethylene, with a filtration area of 0.11 m$^2$) including a porous polyolefin membrane having a cation-exchange group. This was performed at room temperature and a flow rate of 100 grams per minute.

The resulting solution was poured into a solvent mixture containing 6750 g of hexane and 2250 g of ethyl acetate to give precipitates, and the precipitates were repulped with 6500 g of hexane. After removing the supernatant, the residue was transferred to a centrifugal separator, followed by centrifugation to give a wet polymer. The wet polymer was taken out from the centrifugal separator, dried at 50° C. and 20 mmHg (2.66 kPa) for 30 hours, and thereby yielded 105 g of a product polymer. The product polymer had, as content of metals, a sodium (Na) content of 5 ppb, an iron (Fe) content of 4 ppb, and a total metal content of 14 ppb.

Comparative Example 2

A polymer solution was obtained through polymerization by the procedure of Example 1, except for using a commercially available PGMEA as intact. The polymer solution was passed through a membrane filter having a pore diameter of 0.5 μm, and combined with 750 g of a commercially available methyl isobutyl ketone (MIBK). The polymer solution at this stage had a content of metals of 1200 ppb.

The polymer solution was then subjected to a washing treatment by adding 1500 g of water (ultrapure water), stirring, and separating the mixture into an organic layer and an aqueous layer. The organic layer had a content of metals of 250 ppb.

Without passing through porous polyolefin membranes, the organic layer (polymer solution) was poured into a solvent mixture containing 6750 g of hexane and 2250 g of ethyl acetate to give precipitates, and the precipitates were repulped with 6500 g of hexane. After removing the supernatant, the residue was transferred to a centrifugal separator, followed by centrifugation to give a wet polymer. The wet polymer was taken out from the centrifugal separator, dried at 50° C. and 20 mmHg (2.66 kPa) for 30 hours, and thereby yielded 103 g of a product polymer. The product polymer had, as content of metals, a sodium (Na) content of 80 ppb, an iron (Fe) content of 70 ppb, and a total metal content of 250 ppb.

Example 3

Production of Photoresist Polymeric Compound with Following Structure

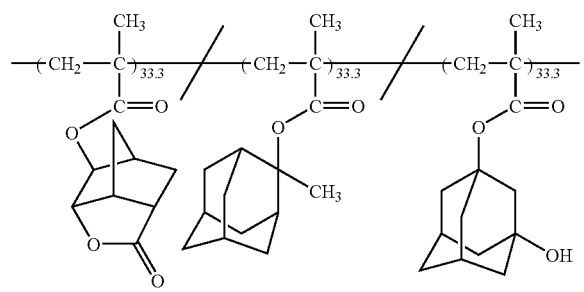

In a reactor equipped with a stirrer, a thermometer, a reflux condenser, a dropping tube, and a nitrogen inlet tube, was placed 70 g of propylene glycol monomethyl ether acetate (PGMEA). After elevating the temperature to 100° C., a solution mixture was added dropwise over 6 hours. The solution mixture was a solution containing 50 g of 5-methacryloyloxy-2,6-norbornanecarbolactone (MNBL) (metal content of 100 ppb or less), 50 g of 2-methacryloyloxy-2-methyladamantane (2-MMA), 50 g of 1-hydroxy-3-methacryloyloxyadamantane (HMA), and 1.8 g of dimethyl 2,2'-azobis(2-methylpropionate) (initiator; supplied by Wako Pure Chemical Industries Ltd. under the trade name V-601) in 530 g of PGMEA. After the completion of dropwise addition, the resulting mixture was aged for 2 hours and thereby yielded a polymer solution containing 20 percent by weight of a polymeric compound represented by the above formula. The polymer solution was filtrated through a membrane filter having a pore diameter of 0.5 μm, and the filtrate was combined with 750 g of methyl isobutyl ketone (MIRK). The polymer solution at this stage had a content of metals of 1200 ppb.

The polymer solution was then subjected to a washing treatment by adding 1500 g of water (ultrapure water), stirring, and separating the mixture into an organic layer and an aqueous layer. The organic layer at this stage had a content of metals of 250 ppb. The organic layer was first passed through "IonKleen AN Purifier" (trade name; supplied by Pall Corporation, made from a polypropylene, with a filtration area of 0.093 m$^2$) including a porous polyolefin membrane having an anion-exchange group. This was performed at room temperature and a flow rate of 100 grams per minute. The solution was thereafter passed through "IonKleen SL Purifier" (trade name; supplied by Pall Corporation, made from a chemically modified ultrahigh-molecular-weight polyethylene, with a filtration area of 0.11 m$^2$) including a porous polyolefin membrane having a cation-exchange group. This was performed at room temperature and a flow rate of 100 grams per minute.

The resulting solution was poured into a solvent mixture containing 6750 g of hexane and 2250 g of ethyl acetate to give precipitates, and the precipitates were repulped with 6500 g of hexane. After removing the supernatant, the residue was transferred to a centrifugal separator, followed by centrifugation to give a wet polymer. The wet polymer was taken out from the centrifugal separator, dried at 50° C. and 20 mmHg (2.66 kPa) for 30 hours, and thereby yielded 105 g of a product polymer. The product polymer had, as content of metals, a sodium (Na) content of 3 ppb, an iron (Fe) content of 3 ppb, and a total metal content of 12 ppb.

Example 4

Production of Photoresist Polymeric Compound with Following Structure

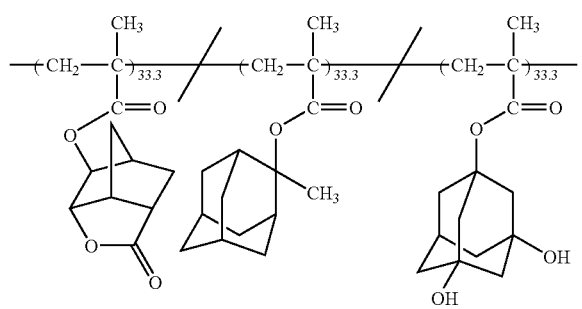

In a reactor equipped with a stirrer, a thermometer, a reflux condenser, a dropping tube, and a nitrogen inlet tube, was placed 70 g of propylene glycol monomethyl ether acetate (PGMEA). After elevating the temperature to 100° C., a solution mixture was added dropwise over 6 hours. The solution mixture was a solution containing 50 g of 5-methacryloyloxy-2,6-norbornanecarbolactone (MNBL) (metal content of 100 ppb or less), 50 g of 2-methacryloyloxy-2-methyladamantane (2-MMA), 50 g of 1,3-dihydroxy-5-methacryloyloxyadamantane (DHMA), and 1.8 g of dimethyl 2,2'-azobis (2-methylpropionate) (initiator; supplied by Wako Pure Chemical Industries Ltd. under the trade name V-601) in 530 g of PGMEA. After the completion of dropwise addition, the resulting mixture was aged for 2 hours and thereby yielded a polymer solution containing 20 percent by weight of a polymeric compound represented by the above formula. The polymer solution was filtrated through a membrane filter having a pore diameter of 0.5 μm, and the filtrate was combined with 750 g of methyl isobutyl ketone (MIBK). The polymer solution at this stage had a content of metals of 1200 ppb.

The polymer solution was then subjected to a washing treatment by adding 1500 g of water (ultrapure water), stirring, and separating the mixture into an organic layer and an aqueous layer. The organic layer at this stage had a content of metals of 250 ppb. The organic layer was first passed through "IonKleen AN Purifier" (trade name; supplied by Pall Corporation, made from a polypropylene, with a filtration area of 0.093 m$^2$) including a porous polyolefin membrane having an anion-exchange group. This was performed at room temperature and a flow rate of 100 grams per minute. The solution was thereafter passed through "IonKleen SL Purifier" (trade name; supplied by Pall Corporation, made from a chemically modified ultrahigh-molecular-weight polyethylene, with a filtration area of 0.11 m$^2$) including a porous polyolefin membrane having a cation-exchange group. This was performed at room temperature and a flow rate of 100 grams per minute.

The resulting solution was poured into a solvent mixture containing 6750 g of hexane and 2250 g of ethyl acetate to give precipitates, and the precipitates were repulped with 6500 g of hexane. After removing the supernatant, the residue was transferred to a centrifugal separator, followed by centrifugation to give a wet polymer. The wet polymer was taken out from the centrifugal separator, dried at 50° C. and 20 mmHg (2.66 kPa) for 30 hours, and thereby yielded 105 g of a product polymer. The product polymer had, as content of metals, a sodium (Na) content of 3 ppb, an iron (Fe) content of 2 ppb, and a total metal content of 9 ppb.

Example 5

Production of Photoresist Polymeric Compound with Following Structure

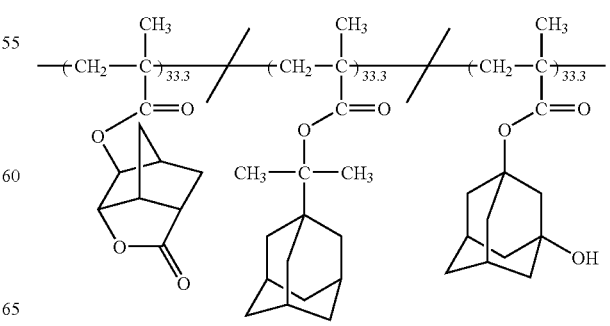

In a reactor equipped with a stirrer, a thermometer, a reflux condenser, a dropping tube, and a nitrogen inlet tube, was placed 70 g of propylene glycol monomethyl ether acetate (PGMEA). After elevating the temperature to 100° C., a solution mixture was added dropwise over 6 hours. The solution mixture was a solution containing 50 g of 5-methacryloyloxy-2,6-norbornanecarbolactone (MNBL) (metal content of 100 ppb or less), 50 g of 1-(1-methacryloyloxy-1-methylethyl)adamantane (IAM), 50 g of 1-hydroxy-3-methacryloyloxyadamantane (HMA), and 1.8 g of dimethyl 2,2'-azobis(2-methylpropionate) (initiator; supplied by Wako Pure Chemical Industries Ltd. under the trade name V-601) in 530 g of PGMEA. After the completion of dropwise addition, the resulting mixture was aged for 2 hours and thereby yielded a polymer solution containing 20 percent by weight of a polymeric compound represented by the above formula. The polymer solution was filtrated through a membrane filter having a pore diameter of 0.5 μm, and the filtrate was combined with 750 g of methyl isobutyl ketone (MIBK). The polymer solution at this stage had a content of metals of 1200 ppb.

The polymer solution was then subjected to a washing treatment by adding 1500 g of water (ultrapure water), stirring, and separating the mixture into an organic layer and an aqueous layer. The organic layer at this stage had a content of metals of 250 ppb. The organic layer was first passed through "IonKleen AN Purifier" (trade name; supplied by Pall Corporation, made from a polypropylene, with a filtration area of 0.093 m$^2$) including a porous polyolefin membrane having an anion-exchange group. This was performed at room temperature and a flow rate of 100 grams per minute. The polymer solution was thereafter passed through "IonKleen SL Purifier" (trade name; supplied by Pall Corporation, made from a chemically modified ultrahigh-molecular-weight polyethylene, with a filtration area of 0.11 m$^2$) including a porous polyolefin membrane having a cation-exchange group. This was performed at room temperature and a flow rate of 100 grams per minute.

The resulting solution was poured into a solvent mixture containing 6750 g of hexane and 2250 g of ethyl acetate to give precipitates, and the precipitates were repulped with 6500 g of hexane. After removing the supernatant, the residue was transferred to a centrifugal separator, followed by centrifugation to give a wet polymer. The wet polymer was taken out from the centrifugal separator, dried at 50° C. and 20 mmHg (2.66 kPa) for 30 hours, and thereby yielded 105 g of a product polymer. The product polymer had, as content of metals, a sodium (Na) content of 4 ppb, an iron (Fe) content of 3 ppb, and a total metal content of 10 ppb.

Example 6

Production of Photoresist Polymeric Compound with Following Structure

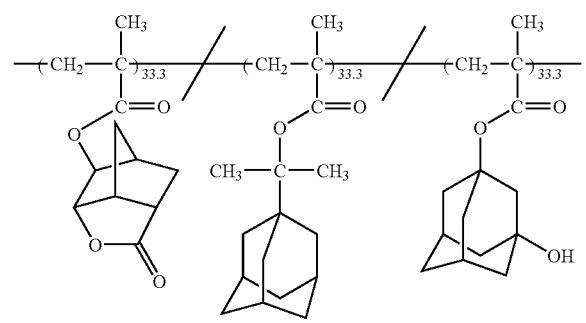

Polymerization and washing treatment were performed by the procedure of Example 5, to give an organic layer. The organic layer was first passed through "IonKleen AN Purifier" (trade name; supplied by Pall Corporation, made from a polypropylene, with a filtration area of 0.093 m$^2$) including a porous polyolefin membrane having an anion-exchange group. This was performed at room temperature and a flow rate of 100 grams per minute. The organic layer was thereafter passed through "Protego Metal Ion Purifier" (trade name; supplied by Nihon Entegris K.K., made from a polyethylene, with a pore diameter of 0.05 μm, and a filtration area of 0.12 m$^2$) including a porous polyolefin membrane having a cation-exchange group. This was performed at room temperature and a flow rate of 100 grams per minute.

The resulting solution was poured into a solvent mixture containing 6750 g of hexane and 2250 g of ethyl acetate to give precipitates, and the precipitates were repulped with 6500 g of hexane. After removing the supernatant, the residue was transferred to a centrifugal separator, followed by centrifugation to give a wet polymer. The wet polymer was taken out from the centrifugal separator, dried at 50° C. and 20 mmHg (2.66 kPa) for 30 hours, and thereby yielded 106 g of a product polymer. The product polymer had, as content of metals, a sodium (Na) content of 2 ppb, an iron (Fe) content of 3 ppb, and a total metal content of 8 ppb.

Evaluation Test

A series of photoresist resin compositions having a polymer concentration of 20 percent by weight was prepared by dissolving 100 parts by weight of each of the polymers prepared in Examples 1 to 6, and Comparative Examples 1 and 2, and 10 parts by weight of triphenylsulfonium hexafluoroantimonate in ethyl lactate. Each of the photoresist resin compositions was applied to a silicon wafer through spin coating to form a photosensitive layer 1.0 μm thick thereon. The resulting article was prebaked on a hot plate at a temperature of 110° C. for 120 seconds, exposed to light via a mask using KrF excimer laser with a wavelength of 247 nm at an irradiance of 30 mJ/cm$^2$, and post-baked at a temperature of 120° C. for 60 seconds. Next, the article was developed with a 0.3 M aqueous tetramethylammonium hydroxide solution for 60 seconds, and subsequently rinsed with pure water.

As a result, 0.30 μm line-and-space patterns were obtained when the polymers prepared in Examples 1 to 6 were used. Line-and-space patterns equivalent to those using the polymers of Examples 1 to 6 were obtained when the polymers prepared in Comparative Examples 1 and 2 were used. However, the polymer prepared in Comparative Example 1 had large metal contents and thereby gave a semiconductor device having inferior electrical properties; and the polymer prepared in Comparative Example 2 had a still not sufficiently reduced iron content and may thereby give a semiconductor device having insufficient electrical properties.

While the above description is of the preferred embodiments of the present invention, it should be appreciated that various modifications, alternations, and variations are possible without deviating from the scope and fair meaning of the following claims.

What is claimed is:

1. A process for producing a photoresist polymeric compound, the process comprising the steps of:
carrying out polymerization of a monomer mixture containing at least one monomer selected from the group consisting of a monomer (a) containing a group capable of leaving with an acid to allow the polymeric compound to be soluble in an alkali, a monomer (b) having a lactone skeleton, and a monomer (c) having a hydroxyl-containing alicyclic skeleton, to give a polymer;
passing a solution containing the polymer through a filter including a porous membrane having an anion-exchange group to give a polymer solution; and
thereafter passing the polymer solution through a filter including a porous membrane having a cation-exchange group,
wherein said passing through the two porous membrane filters in this order thereby reduces the metal content in the polymer solution,
wherein the metal content in the polymer solution is sodium content or both sodium content and iron content, and
wherein the polymer solution before the step of passing through the filter including a porous membrane having a cation-exchange group has a content of metals of 1000 parts per billion by weight or less per the weight of the polymer.

2. The process according to claim 1, wherein the polymerization of the monomer mixture is performed through dropping polymerization to give the polymer.

3. The process according to claim 1, further comprising the step of washing the polymer solution with water after the step of carrying out polymerization and before the step of passing the polymer solution through the filter including a porous membrane having an anion-exchange group.

4. The process according to claim 1, wherein the monomer (a) containing a group capable of leaving with an acid to allow the polymeric compound to be soluble in an alkali is at least one of compounds represented by following Formulae (1a), (1b), (1c), (1d), and (1e):

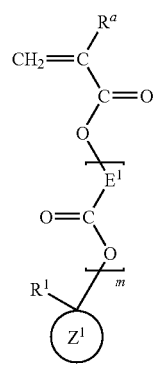

(1a)

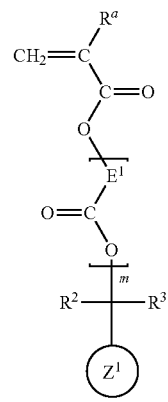

(1b)

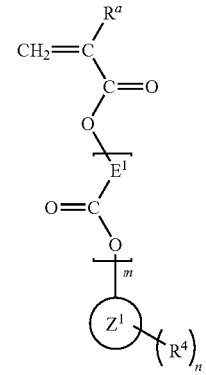

(1c)

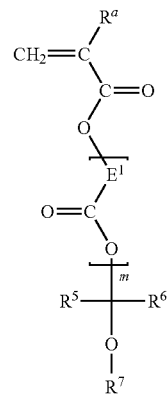

(1d)

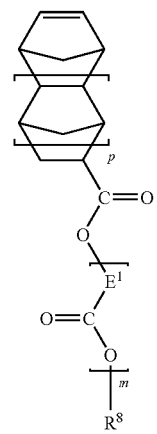

(1e)

wherein Ring $Z^1$ represents a substituted or unsubstituted monocyclic or polycyclic alicyclic hydrocarbon ring having 5 to 20 carbon atoms;
$R^a$ represents one selected from the group consisting of hydrogen atom, a halogen atom, and an alkyl or haloalkyl group having 1 to 6 carbon atoms;
$E^1$s each represent a bivalent hydrocarbon group having 1 to 12 carbon atoms;
"m" denotes an integer of 0 to 3;
$R^1$, $R^2$, and $R^3$ are the same as or different from one another and each represent a substituted or unsubstituted alkyl group having 1 to 6 carbon atoms;
$R^4$s are substituents bonded to Ring $Z^1$, are the same as or different from each other, and each represent one selected from the group consisting of oxo group, an alkyl group, a protected or unprotected hydroxyl group, a protected or unprotected hydroxyalkyl group, and a protected or unprotected carboxyl group;
"n" is the number of $R^4$s and denotes an integer of 1 to 3, wherein at least one of $nR^4$s is a —$COOR^i$ group, wherein $R^i$ represents one selected from the group consisting of a substituted or unsubstituted tertiary hydrocarbon group, a tetrahydrofuranyl group, a tetrahydropyranyl group, and an oxepanyl group;
$R^5$ and $R^6$ are the same as or different from each other and each represent hydrogen atom, or a substituted or unsubstituted alkyl group having 1 to 6 carbon atoms;
$R^7$ represents hydrogen atom or an organic group, wherein at least two of $R^5$, $R^6$, and $R^7$ may be combined to form a ring with an adjacent atom;
$R^8$ represents one selected from the group consisting of t-butyl group, 2-tetrahydrofuranyl group, 2-tetrahydropyranyl group, and 2-oxepanyl group; and
"p" denotes 0 or 1.

5. The process according to claim 1, wherein the monomer (b) having a lactone skeleton is at least one of compounds represented by following Formulae (2a), (2b), (2c), (2d), (2e), (2f), (2g), and (2h):

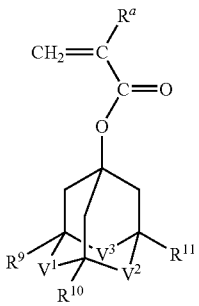

(2a)

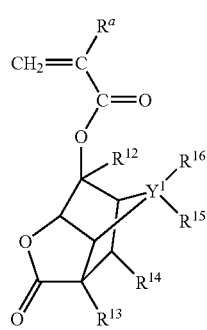

(2b)

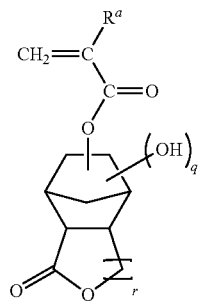

(2c)

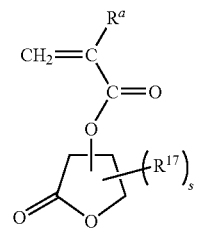

(2d)

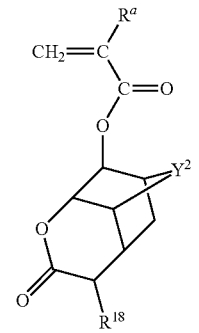

(2e)

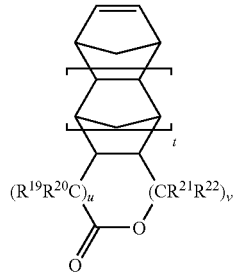

(2f)

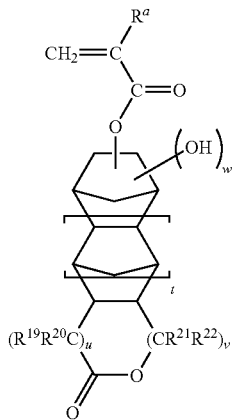

(2g)

-continued (2h)

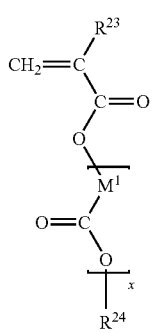

wherein $R^a$ represents one selected from the group consisting of hydrogen atom, a halogen atom, and an alkyl or haloalkyl group having 1 to 6 carbon atoms;

$R^9$, $R^{10}$, and $R^{11}$ are the same as or different from one another and each represent one selected from the group consisting of hydrogen atom, an alkyl group, a protected or unprotected hydroxyl group, a protected or unprotected hydroxyalkyl group, and a protected or unprotected carboxyl group;

$V^1$, $V^2$, and $V^3$ are the same as or different from one another and each represent one selected from the group consisting of —$CH_2$—, —CO—, and —COO—, wherein at least one of $V^1$, $V^2$, and $V^3$ is —COO—;

$Y^1$ represents one selected from the group consisting of carbon atom, oxygen atom, and sulfur atom, wherein $R^{15}$ and $R^{16}$ are present only when $Y^1$ is carbon atom;

$R^{12}$, $R^{13}$, $R^{14}$, $R^{15}$, $R^{16}$, and $R^{17}$s are the same as or different from one another and each represent one selected from the group consisting of hydrogen atom, an alkyl group, a protected or unprotected hydroxyl group, a protected or unprotected hydroxyalkyl group, a protected or unprotected carboxyl group, cyano group, a halogen atom, and a fluoroalkyl group having 1 to 6 carbon atoms;

"q" denotes an integer of 0 or 1;

"r" denotes an integer of 1 or 2;

"s" denotes an integer of 0 to 5;

$Y^2$ represents one selected from the group consisting of oxygen atom, sulfur atom, and methylene group;

$R^{18}$ represents hydrogen atom or an alkyl group having 1 to 6 carbon atoms;

$R^{19}$, $R^{20}$, $R^{21}$, and $R^{22}$ are the same as or different from one another and each represent hydrogen atom or methyl group;

"t", "u", "v", and "w" independently denote 0 or 1;

$R^{23}$ represents one selected from the group consisting of hydrogen atom, a halogen atom, and a substituted or unsubstituted alkyl group having 1 to 6 carbon atoms;

$R^{24}$ represents a group having a lactone skeleton;

$M^1$s each represent a bivalent organic group having 1 to 6 carbon atoms; and

"x" denotes an integer of 1 to 3.

6. The process according to claim 1, wherein the monomer (c) having a hydroxyl-containing alicyclic skeleton is at least one of compounds represented by following Formula (3a):

(3a)

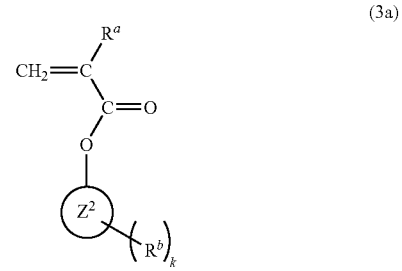

wherein $R^a$ represents one selected from the group consisting of hydrogen atom, a halogen atom, and an alkyl or haloalkyl group having 1 to 6 carbon atoms;

Ring $Z^2$ represents a monocyclic or polycyclic alicyclic hydrocarbon ring having 5 to 20 carbon atoms;

$R^b$s are substituents bonded to Ring $Z^2$ and represent one selected from the group consisting of a halogen atom, an alkyl or haloalkyl group having 1 to 6 carbon atoms, an alkoxy group having 1 to 6 carbon atoms, hydroxyl group, carboxyl group, and amino group; and "k" denotes an integer of 1 to 4, wherein, when "k" is 2 or more, two or more $R^b$s may be the same as or different from each other, and wherein at least one of $kR^b$s is hydroxyl group.

7. A process for producing a photoresist resin composition, the process comprising the steps of:
producing a photoresist polymeric compound by the process according to claim 1; and
mixing the resulting photoresist polymeric compound with a photosensitive acid generator.

8. A process for producing a semiconductor device, the process comprising the steps of:
producing a photoresist resin composition by the process according to claim 7;
forming a photosensitive layer with the photoresist resin composition; and
exposing, developing, and thereby patterning the photosensitive layer.

* * * * *